(12) United States Patent
Werner et al.

(10) Patent No.: US 11,633,948 B2
(45) Date of Patent: Apr. 25, 2023

(54) METHOD FOR MAKING LITHOGRAPHIC PRINTING PLATES

(71) Applicant: Eastman Kodak Company, Rochester, NY (US)

(72) Inventors: Saija Werner, Hattorf (DE); Stefanie Hansmann, Osterode (DE); Udo Dwars, Herzberg (DE); Christopher D. Simpson, Osterode (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 100 days.

(21) Appl. No.: 17/073,767

(22) Filed: Oct. 19, 2020

(65) Prior Publication Data

US 2021/0221116 A1 Jul. 22, 2021

Related U.S. Application Data

(60) Provisional application No. 62/964,207, filed on Jan. 22, 2020.

(51) Int. Cl.

| | | |
|---|---|---|
| *B41C 1/10* | (2006.01) | |
| *G03F 7/027* | (2006.01) | |
| *G03F 7/11* | (2006.01) | |
| *G03F 7/30* | (2006.01) | |

(52) U.S. Cl.
CPC .......... *B41C 1/1016* (2013.01); *B41C 1/1066* (2013.01); *G03F 7/027* (2013.01); *G03F 7/11* (2013.01); *G03F 7/3057* (2013.01); *B41C 2201/02* (2013.01); *B41C 2210/04* (2013.01); *B41C 2210/12* (2013.01)

(58) Field of Classification Search
CPC ....................................................... G03F 7/11
See application file for complete search history.

(56) References Cited

U.S. PATENT DOCUMENTS

| | | | |
|---|---|---|---|
| 3,458,311 A | 7/1969 | Alles | |
| 3,615,480 A | 10/1971 | Lam | |
| 5,155,012 A | 10/1992 | Joerg et al. | |
| 5,294,644 A * | 3/1994 | Login | A01N 25/04 |
| | | | 514/698 |
| 9,114,602 B2 | 8/2015 | Sonokawa | |
| 9,329,485 B2 | 5/2016 | Simpson et al. | |
| 10,022,944 B2 | 7/2018 | Schuman et al. | |
| 2007/0287094 A1 | 12/2007 | Mori | |
| 2013/0280499 A1* | 10/2013 | Kanno | C09D 5/00 |
| | | | 106/287.26 |
| 2016/0077437 A1* | 3/2016 | Simpson | G03F 7/38 |
| | | | 430/302 |

FOREIGN PATENT DOCUMENTS

| | | |
|---|---|---|
| EP | 1 804 124 A1 | 7/2007 |
| EP | 2 233 311 A1 | 9/2010 |
| EP | 2233311 A1 * | 9/2010 ............... B41N 3/08 |
| EP | 2302463 A1 | 3/2011 |
| EP | 2 366 546 A2 | 9/2011 |
| EP | 2632256 B1 | 2/2017 |
| EP | 2762974 B1 | 7/2017 |
| KR | 20080099413 A | 11/2008 |
| WO | WO2012/061370 A2 | 5/2012 |
| WO | 2013/019866 | 2/2013 |
| WO | WO2016/040004 A1 | 3/2016 |

* cited by examiner

*Primary Examiner* — Chanceity N Robinson
(74) *Attorney, Agent, or Firm* — J. Lanny Tucker

(57) ABSTRACT

Lithographic printing plates are provided by imagewise exposing negative-working lithographic printing plate precursors having one or more radiation-sensitive imageable layers, followed by contacting with a processing solution that contains up to 10 weight % of one or more compounds represented by Structure (I) shown as follows:

$$R^1\text{—}C(\text{=}O)\text{—}N(R^2)\text{—}R^3 \qquad (I)$$

wherein $R^1$, $R^2$, and $R^3$ independently represent hydrogen or a substituted or unsubstituted hydrocarbon group, or two or three of $R^1$, $R^2$, and $R^3$ are combined to form one or more cyclic rings, and the total number of carbon atoms in the Structure (I) molecule is at least 7 and up to and including 33. Both negative-working and positive-working lithographic precursors can be imaged and processed using this processing solution using one or more successive applications of the same or different processing solution. The processing solution can be derived from a corresponding processing solution concentrate that can also be used for replenishment.

15 Claims, No Drawings

METHOD FOR MAKING LITHOGRAPHIC PRINTING PLATES

FIELD OF THE INVENTION

This invention relates to a method for preparing lithographic printing plates from radiation-sensitive lithographic printing plate precursors. After imagewise exposure, such imagewise exposed precursors are processed one or more successive times using a processing solution containing a unique combination of components including a non-polymeric amide to provide improved developability and processor cleanliness. This invention also relates to a working strength processing solution and concentrates from which it can be derived, all useful in the method of this invention.

BACKGROUND OF THE INVENTION

In lithographic printing, lithographic ink receptive regions, known as image areas, are generated on a hydrophilic surface. When the hydrophilic surface is moistened with water and lithographic ink is applied, the hydrophilic regions retain the water and repel the lithographic ink and the lithographic ink receptive regions accept the lithographic ink and repel the water. The lithographic ink is then transferred to the surface of suitable materials upon which the image is to be reproduced. In some instances, the lithographic ink can be first transferred to an intermediate blanket that in turn is used to transfer the lithographic ink to the surface of the materials upon which the image is to be reproduced.

Lithographic printing plate precursors useful to prepare lithographic (or offset) printing plates typically comprise one or more radiation-sensitive imageable layers disposed on a hydrophilic surface of a substrate (or intermediate layers). The radiation-sensitive imageable layer(s) can comprise one or more radiation-sensitive components dispersed within a suitable binder. Following imaging, either the imagewise exposed regions or the imagewise non-exposed regions of the imageable layer(s) are removed by a suitable developer (processing solution), revealing the underlying hydrophilic surface of the substrate. If the imagewise exposed regions are removed, the precursor is considered as positive-working. Conversely, if the imagewise non-exposed regions are removed, the precursor is considered as negative-working. In each instance, the regions of the radiation-sensitive imageable layer(s) that remain are lithographic ink-receptive, and the regions of the hydrophilic surface revealed by the developing process accept water or aqueous solutions (typically a fountain solution), and repel lithographic ink.

"Laser direct imaging" methods (LDI) are used to directly form an offset lithographic printing plate or printing circuit board using digital data from a computer. There have been considerable improvements in this field from use of more efficient lasers, improved radiation-sensitive imageable compositions and components thereof, and improved processing solutions and procedures.

Various radiation-sensitive compositions are used in negative-working UV, visible, or near-IR-sensitive lithographic printing plate precursors as described in numerous publications such as U.S. Pat. No. 9,329,485 (Simpson et al.) that describes a method of forming lithographic printing plates using weakly alkaline processing solutions without separate gumming steps.

Processing solutions have been designed for each type of lithographic printing plate precursor and imaging chemistry. Some processing solutions comprise one or more anionic or nonionic surfactants, one or more organic solvents, and other addenda to provide desired pH and processing properties. Examples of useful processing solution components are described for example, in U.S. Pat. No. 9,329,485 (noted above).

U.S. Pat. No. 5,155,012 (Joerg et al.) describes processing concentrates and working strength solutions for use with negative-working radiation-sensitive compositions, which processing concentrates and diluted processing solutions include emulsifiers that include polymeric materials derived from amide-containing vinyl monomers, polyvinyl alcohol, dextrin, and other hydrophilic materials.

EP 2,302,463A1 (Fujifilm Corporation) describes UV (violet)-sensitive negative-working lithographic printing plate precursors that can be imaged and processed using processing solutions containing organic solvents such as alcohols, esters, amido group-containing compounds, and sulfur-containing compounds [0128]. The useful amido group-containing compounds include the compounds in [0131], each of which has 6 or less carbon atoms in the molecule.

While useful processing solutions have been designed for various imaged precursors as described in U.S. Pat. No. 9,329,485 (noted above), there remains a need for (1) further improvement in the characteristics of processed lithographic printing plate precursors such as completeness of removing the radiation imageable layers from the hydrophilic substrate surface in the radiation imagewise exposed or non-exposed regions; (2) further improvement in the ability to process a large number of imagewise exposed lithographic printing plate precursors in a processing cycle that extends from the point where the processing equipment is filled with the fresh processing solution to the point when it becomes necessary to replace the processing solution; and (3) further improvement in the ability to clean the processing equipment between processing cycles without intensive labor and/or use of hazardous cleaning chemicals.

SUMMARY OF THE INVENTION

The present invention provides a method for preparing a lithographic printing plate, the method comprising the steps of, in order:

(A) imagewise exposing a lithographic printing plate precursor comprising a substrate having a hydrophilic surface, and having disposed on the hydrophilic surface of the substrate:

one or more radiation-sensitive imageable layers including an outermost radiation-sensitive imageable layer, and optionally, a non-radiation-sensitive hydrophilic overcoat disposed on the outermost radiation-sensitive imageable layer, to provide an imagewise exposed precursor comprising exposed regions and non-exposed regions in the one or more radiation-sensitive imageable layers;

(B) treating the imagewise exposed precursor with one or more successive applications of a processing solution ("inventive" processing solution) to remove either the exposed regions or the non-exposed regions in the one or more radiation-sensitive imageable layers, to provide a lithographic printing plate, wherein the processing solution comprises:

one or more compounds represented by the following Structure (I), in an amount of at least 0.1 weight % and up to and including 10 weight %, based on the total weight of the processing solution, $$R^1-C(=O)-N(R^2)-R^3 \qquad (I)$$

wherein $R^1$, $R^2$, and $R^3$ independently represent hydrogen or a substituted or unsubstituted hydrocarbon group, or two or three of $R^1$, $R^2$, and $R^3$ are combined to form one or more cyclic rings, and the total number of carbon atoms in the Structure (I) molecule is at least 7 and up to and including 33.

Moreover, the present invention further provides a processing solution (inventive processing solution) for developing imagewise exposed lithographic printing plate precursors, the processing solution having a pH of at least 2 and a % non-volatiles of at least 1 weight % and up to and including 15 weight %, the processing solution comprising:

one or more compounds represented by the following Structure (I), in an amount of at least 0.1 weight % and up to and including 10 weight %, based on the total weight of the processing solution,

$$R^1\!\!-\!\!C(\!=\!O)\!\!-\!\!N(R^2)\!\!-\!\!R^3 \qquad (I)$$

wherein $R^1$, $R^2$, and $R^3$ independently represent hydrogen or a substituted or unsubstituted hydrocarbon group, or two or three of $R^1$, $R^2$, and $R^3$ are combined to form one or more cyclic rings, and the total number of carbon atoms in the Structure (I) molecule is at least 7 and up to and including 33.

The present invention further provides a processing solution concentrate suitable for developing imagewise exposed lithographic printing plate precursors upon dilution with water, the processing solution concentrate having a pH of at least 2 and a % non-volatiles of at least 3% and up to and including 45%, the processing solution concentrate comprising:

one or more compounds represented by the following Structure (I), in an amount of at least 0.2 weight % and up to and including 30 weight %, based on the total weight of the processing solution concentrate:

$$R^1\!\!-\!\!C(\!=\!O)\!\!-\!\!N(R^2)\!\!-\!\!R^3 \qquad (I)$$

wherein $R^1$, $R^2$, and $R^3$ independently represent hydrogen or a substituted or unsubstituted hydrocarbon group, or two or three of $R^1$, $R^2$, and $R^3$ are combined to form one or more cyclic rings, and the total number of carbon atoms in the Structure (I) molecule is at least 7 and up to and including 33.

This processing solution concentrate can be used in an inventive method for preparing a lithographic printing plate, the method comprising the steps of, in order:

(A) imagewise exposing a lithographic printing plate precursor comprising a substrate having a hydrophilic surface, and having disposed on the hydrophilic surface of the substrate:

one or more radiation-sensitive imageable layers including an outermost radiation-sensitive layer, and optionally, a non-radiation-sensitive hydrophilic overcoat disposed on the outermost radiation-sensitive imageable layer, to provide an imagewise exposed precursor comprising exposed regions and non-exposed regions in the one or more radiation-sensitive imageable layers;

(B) treating the imagewise exposed precursor with one or more successive applications of a processing solution to remove either the exposed regions or the non-exposed regions in the one or more radiation-sensitive imageable layers, to provide a lithographic printing plate, wherein the processing solution is prepared in situ by diluting the inventive processing solution concentrate described herein with water.

The present invention provides a method for processing imagewise exposed precursors in which the processed (or developed) lithographic printing plate precursors have less residual radiation imageable coating (or materials) on the hydrophilic substrate surface in the radiation imagewise exposed regions for positive working precursors or imagewise non-exposed regions for negative working precursors. In addition, the present invention allows for more imagewise exposed lithographic printing plate precursors to be processed in a processing cycle that extends from the point where the processing equipment is filled with inventive fresh processing solution to the point when it becomes necessary to replace the processing solution. Moreover, using the present invention allows the processing equipment to be cleaned more easily at the end of the processing cycles without intensive labor and/or use of hazardous cleaning chemicals.

The advantages are achieved by using one or more successive processing steps using a processing solution according to the present invention that contains one or more compounds represented by Structure (I) defined herein.

In some embodiments, the imagewise exposed precursor is treated with a single application of the inventive processing solution. In other embodiments, two successive applications of the same or different inventive processing solution are carried out. In still other embodiments, a single inventive processing solution is used, following by gumming with a gumming solution that contains no compounds represented by Structure (I).

DETAILED DESCRIPTION OF THE INVENTION

The following discussion is directed to various embodiments of the present invention and while some embodiments can be more desirable for specific uses, the disclosed embodiments should not be interpreted or otherwise considered to limit the scope of the present invention, as claimed below. In addition, one skilled in the art will understand that the following disclosure has broader application than is explicitly described for the discussion of any particular embodiment.

Definitions

As used herein to define various components of the inventive processing solutions, radiation-sensitive imageable layer formulations, non-radiation-sensitive hydrophilic overcoat formulations, unless otherwise indicated, the singular forms "a," "an," and "the" are intended to include one or more of the components (that is, including plurality referents).

Each term that is not explicitly defined in the present application is to be understood to have a meaning that is customary or commonly accepted by those skilled in the lithographic printing art. If the construction of a term would render it meaningless or essentially meaningless in its context, the term definition can be taken from a standard published dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor," "precursor," "negative-working lithographic printing plate precursor," and "positive-working lithographic printing plate precursors" are meant to be equivalent references to embodiments of the present invention.

The term "support" is used herein to refer to an aluminum-containing material (web, sheet, foil, or other form) that is then treated to prepare a "substrate" that refers to an article having a hydrophilic surface upon which various layers, including radiation-sensitive imageable layer(s), are disposed.

As used herein, the term "radiation absorber" refers to compounds or materials that can absorb certain wavelengths of radiation and thus provide energy sources to trigger physical or chemical reactions within the radiation-sensitive composition (or formulation) in which they are disposed.

As used herein, the term "infrared" refers to radiation having a $\lambda_{max}$ of at least 750 nm and higher. Thus, the term "infrared" is used to refer to the "near-infrared" region of the electromagnetic spectrum that is defined herein to be at least 750 nm and up to and including 1400 nm, as well has higher wavelengths.

As used herein, the term "UV and violet radiation" generally refers to radiation having a $\lambda_{max}$ of at least 250 nm and up to and including 550 nm. This range also encompasses some of the "visible" range of the electromagnetic spectrum.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

The term "copolymer" refers to polymers composed of two or more different repeating or recurring units.

As used herein, the term "ethylenically unsaturated polymerizable component" refers to a compound comprising one or more ethylenically unsaturated (—C=C—) bonds that are polymerizable using free radical or acid-catalyzed polymerization reactions and conditions. It is not meant to refer to chemical compounds that have only unsaturated —C=C— bonds that are not polymerizable under these conditions.

As used herein, the term "layer" or "coating" can consist of one disposed or applied layer or a combination of several sequentially disposed or applied layers. The one or more layers are considered radiation-sensitive or imageable if at least one of the layers is radiation-sensitive.

As used herein for describing processing solutions, the term "% non-volatiles" refers to total weight % of all ingredients in the processing solution that exist either: in a solid form at 25° C. and atmospheric pressure; or in a liquid form and having a boiling point at atmospheric pressure equal to or greater than 150° C.

Uses

The present invention is useful for preparing lithographic printing plates by imagewise exposing and processing the imagewise exposed precursor with the inventive processing solution or inventive processing solution concentrate described below, in suitable processing apparatus or equipment. This method can be carried out by omitting rinsing and gumming treatments and steps, if desired, between successive uses of the processing solution (developer) and mounting the exposed and processed precursor onto a printing press.

Substrate

The substrate that is present in the precursors described herein generally has a hydrophilic surface, or at least a surface that is more hydrophilic than the applied radiation-sensitive imageable layer on the imaging side. The substrate comprises a support that can be composed of any material that is conventionally used to prepare lithographic printing plate precursors. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both flat surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidyloxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 g/m$^2$ and up to and including 5 g/m$^2$. Phosphoric acid anodization generally provides an oxide weight on the surface of from at least 1.5 g/m$^2$ and up to and including 5 g/m$^2$.

An interlayer can be formed by treatment of the aluminum support with, for example, a silicate, dextrin, calcium zirconium fluoride, hexafluorosilicic acid, poly(vinyl phosphonic acid) (PVPA), vinyl phosphonic acid copolymer, poly [(meth)acrylic acid], or acrylic acid copolymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents, a slipping layer, or a matte layer to improve handling and "feel" of the imageable element.

Negative-Working Radiation-Sensitive Imageable Layers

Useful precursors can be formed by suitable application of a negative-working radiation-sensitive composition as described below to a suitable substrate to form a negative-working radiation-sensitive imageable layer on that substrate. In general, the negative-working radiation-sensitive composition (and imageable layer) comprises one or more free radical polymerizable components, one or more radiation absorbers (also identified as "sensitizers" in some embodiments), an initiator composition containing one or more free radical initiators that are capable of generating free radicals upon exposure to imaging radiation, and optionally a polymeric binder, which components are described in more detail below. There is generally only a single negative-working radiation-sensitive imageable layer comprising the negative-working radiation-sensitive composition in such precursors. It can also be the outermost layer in the precursor, but in some embodiments, there is an outermost water-soluble, non-radiation-sensitive hydrophilic overcoat layer (also known as a topcoat) disposed over the one or more negative-working radiation-sensitive imageable layers. Such a non-radiation-sensitive hydrophilic overcoat layer is described below.

Many details of negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), EP 2,302,463 (noted above), and U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Strehmel et al.), U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Pat. No. 9,329,485 (noted above), and U.S. Publication Numbers 2003/0064318 (Huang et al.), 2004/0265736 (Aoshima et al.), 2005/0266349 (Van Damme et al.), 2006/0019200 (Vermeersch et al.), and 2009/0092923 (Hayashi) the disclosures of all of which are incorporated herein by reference.

The radiation-sensitive compositions and negative-working radiation-sensitive imageable layers used in precursors can include one or more non-radiation-sensitive polymeric binders although such materials are not essential if the free radical polymerizable component described below can also act as a polymeric binder. Useful non-radiation-sensitive polymeric binders include but are not limited to, those that are present at least partially as discrete particles (non-agglomerated particles). Such non-radiation-sensitive polymeric binders can be present as discrete particles having an average particle size of at least 10 nm and up to and including 500 nm, and typically of at least 100 nm and up to and including 450 nm, and that are generally distributed uniformly within that layer. The particulate non-radiation-sensitive polymeric binders exist at room temperature as discrete particles, for example in an aqueous dispersion. Such non-radiation-sensitive polymeric binders generally have a number average molecular weight ($M_n$) of at least 5,000 and typically at least 20,000 and up to and including 1,000,000, or of at least 30,000 and up to and including 200,000, as determined by Gel Permeation Chromatography.

Useful particulate non-radiation-sensitive polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (noted above), U.S. Pat. No. 7,005,234 (Hoshi et al.), and U.S. Pat. No. 7,368,215 (Munnelly et al.), and U.S. Publication No. 2005/0003285 (Hayashi et al.), the disclosures of all of which are incorporated herein by reference with respect to these non-radiation-sensitive polymeric binders. More specifically, such non-radiation-sensitive polymeric binders include but are not limited to, graft copolymers having both hydrophobic and hydrophilic segments, block and graft copolymers having polyethylene oxide (PEO) segments, polymers having both pendant poly (alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, particulate non-radiation-sensitive polymeric binders can have a backbone comprising multiple (at least two) urethane moieties.

Other useful non-radiation-sensitive polymeric binders are particulate poly(urethane-acrylic) hybrids that are distributed (usually uniformly) throughout the imageable layer. Each of these hybrids has a number average molecular weight ($M_n$) of at least 50,000 and up to and including 500,000 and the particles have an average particle size of at least 10 nm and up to and including 10,000 nm (typically at least 30 nm and up to and including 500 nm or at least 30 nm and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the HYBRIDUR® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, antifoaming agents, dispersing agents, anti-corrosive agents, and optionally pigments and water-miscible organic solvents.

Still other useful non-radiation-sensitive polymeric binders can be homogenous, that is, film-forming, non-particulate, or dissolvable in the coating solvent. Such non-radiation-sensitive polymeric binders include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), U.S. Pat. No. 8,119,331 (Baumann et al.), and U.S. Pat. No. 6,893,797 (Munnelly et al.), the disclosures of all of which are incorporated herein by reference. Also useful are the vinyl carbazole polymers described in U.S. Pat. No. 7,175,949 (Tao et al.), and the polymers having pendant vinyl groups as described in U.S. Pat. No. 7,279,255 (Tao et al.), the disclosures of which are incorporated herein by reference. Useful are random copolymers derived from polyethylene glycol methacrylate/-acrylonitrile/styrene monomers in random fashion and in particulate form, dissolved random copolymers derived from carboxyphenyl methacrylamide/-acrylonitrile/methacrylamide/N-phenyl maleimide, random copolymers derived from polyethylene glycol methacrylate/acrylonitrile/vinyl carbazole/styrene/-methacrylic acid, random copolymers derived from N-phenyl maleimide/-methacrylamide/methacrylic acid, random copolymers derived from urethane-acrylic intermediate A (the reaction product of p-toluene sulfonyl isocyanate and hydroxyl ethyl methacrylate)/acrylonitrile/N-phenyl maleimide, and random copolymers derived from N-methoxymethyl methacrylamide/-methacrylic acid/acrylonitrile/n-phenylmaleimide.

The non-radiation-sensitive polymeric binders also can be selected from any alkaline solution soluble (or dispersible) polymer having an acid value of at least 20 meq KOH/g of polymer and up to and including 400 meq KOH/g of polymer. The following described non-radiation-sensitive polymeric binders are useful in the manner but this is not an exhaustive list:

Useful film-forming polymers can be formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.). Some particularly useful non-radiation-sensitive polymeric binders in this class are derived from one or more (meth)acrylic acids, (meth)acrylate esters, styrene and its derivatives, vinyl carbazoles, and poly(alkylene oxide) (meth)acrylates.

Other useful film-forming polymers can have all carbon backbones wherein at least 40 mol % and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. Such non-radiation-sensitive polymeric binders are described in more detail in U.S. Publication No. 2008-0280229 (Tao et al.).

Film-forming polymers that have pendant 1H-tetrazole groups as described in U.S. Publication No. 2009-0142695 (Baumann et al.) are also useful.

Still other useful non-radiation-sensitive polymeric binders can be film-forming or exist as discrete particles and include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.), the disclosure of all of which are incorporated herein by reference. Also useful are the vinyl carbazole polymers described in U.S. Pat. No. 7,175,949 (Tao et al.) the disclosure of which is incorporated herein by reference.

When present, the total non-radiation-sensitive polymeric binders can be provided in a negative-working radiation-sensitive imageable layer in an amount of at least 20 weight % or at least 30 weight %, and up to and including 60 weight %, or up to and including 70 weight %, based on the total dry negative-working radiation-sensitive imageable layer weight (or total solids of the corresponding coating formulation).

The negative-working radiation-sensitive composition (and negative-working radiation-sensitive imageable layer) comprises one or more free radical polymerizable components, each of which contains one or more free radically polymerizable groups that can be polymerized using free radical initiation. For example, such free radical polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radical polymerizable groups can also be used, which polymers can also perform as polymeric binders in the radiation-sensitive compositions. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radical polymerizable component comprises carboxyl groups.

Free radical polymerizable components include urea urethane (meth)acrylate compounds or urethane (meth)acrylate compounds having multiple polymerizable groups. For example, a free radical polymerizable component can be prepared by reacting DESMODUR™ N100 aliphatic polyisocyanate resin based on hexamethylene diisocyanate (Bayer Corp., Milford, Conn.) with hydroxyethyl acrylate and pentaerythritol triacrylate. Useful free radical polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radical polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radical polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.), the disclosures of which are incorporated herein by reference. Other useful free radical polymerizable components include those described in U.S. Publication No. 2009/0142695 (Baumann et al.), which radically polymerizable components include 1H-tetrazole groups, and which disclosure is incorporated herein by reference.

Some higher molecular weight radically polymerizable components, upon polymerization or crosslinking can also perform as polymeric binders in the radiation-sensitive imageable layer, so that less or none of the non-radiation-sensitive polymeric binders described above is required. For example, such polymers can be film-forming polymers having pendant allyl ester groups as described in U.S. Pat. No. 7,332,253 (Tao et al.). Such polymers can also include pendant cyano groups or have recurring units derived from a variety of other monomers as described in Col. 8, line 31 to Col. 10, line 3 of the noted patent.

Other film-forming polymers that have one or more ethylenically unsaturated pendant groups (reactive vinyl groups) attached to the polymer backbone can be used in this manner. Such reactive groups are capable of undergoing polymerization or crosslinking in the presence of free radicals. The pendant groups can be directly attached to the polymer backbone with a carbon-carbon bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.). Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.).

The useful amount of one or more free radical polymerizable component(s) present in the radiation-sensitive imageable layer can be at least 5 weight % or at least 10 weight %, and up to and including 80 weight % or up to and including 95 weight %, based on the total dry weight of the radiation-sensitive imageable layer (or total solids of the corresponding coating formulation).

The negative-working radiation-sensitive composition (negative-working radiation-sensitive imageable layer) also includes an initiator composition that includes one or more free radical initiators that are capable of generating free radicals sufficient to initiate polymerization of all the various free radical polymerizable components upon exposure of the radiation-sensitive composition to imaging radiation. The initiator composition is generally responsive, for example, to any desired electromagnetic radiation in the desired spectral regions, for example in the spectral range of at least 250 nm and up to and including 1400 nm. In some embodiments, the initiator composition is responsive to near-infrared radiation of at least 750 nm and up to and including 1400 nm or of at least 750 nm and up to and including 1250 nm. In other embodiments, the initiator composition is responsive to exposing radiation in the UV, violet, and visible region of at least 250 nm and up to and including 550 nm and typically of at least 350 nm and up to and including 500 nm. The initiator composition can be designed for any or several of the noted radiation exposure wavelengths.

For example, the initiator composition can include one or more electron acceptors and one or more co-initiators that are capable of donating electrons, hydrogen atoms, or a hydrocarbon radical.

In general, suitable initiator compositions include but are not limited to, aromatic sulfonylhalides, trihalogenomethyl-sulfones, imides (such as N-benzoyloxy-phthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), $\alpha$-hydroxy or $\alpha$-amino-acetophenones, trihalogenomethyl-arylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.) the disclosure of which is incorporated herein by reference, trihalomethyl substituted triazines, boron-containing compounds (such as tetraarylborates and alkyltriarylborates) and organoborate salts such as those described in U.S. Pat. No. 6,562,543 (Ogata et al.) the disclosure of which is incorporated herein by reference, and onium salts (such as ammonium salts, diaryliodonium salts, triarylsulfonium salts, aryldiazonium salts, and N-alkoxypyridinium salts).

Hexaarylbiimidazoles (HABI's), onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles (HABI's) are also described in U.S. Pat. No. 4,565,769 (Dueber et al.) and U.S. Pat. No. 3,445,232 (Shirey), the disclosures of which are incorporated herein by reference, and which can be prepared according to known methods, such as the oxidative dimerization of triarylimidazoles. These compounds are sometimes identified as "sensitizers" for UV/violet light-sensitive compositions as they can also serve as radiation absorbers (see below).

Useful initiator compositions for near-infrared radiation-sensitive compositions include onium compounds (salts) including ammonium, sulfonium, iodonium, diazonium, and phosphonium compounds, particularly in combination with infrared radiation-sensitive cyanine dyes. Useful iodonium cations are well known in the art including but not limited to, U.S. Publication No. 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.), the disclosures of all of which are incorporated herein by reference. For example, a useful iodonium cation includes a positively charged iodonium, (4-methylphenyl)[4-(2-methylpropyl)phenyl]-moiety and a suitable negatively charged counterion.

Iodonium cations can be supplied as part of one or more iodonium salts, and the iodonium cations can be supplied as iodonium borates also containing suitable boron-containing anions particularly in combination with infrared radiation-sensitive cyanine dyes. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) the disclosure of which is incorporated herein by reference.

Useful near-infrared radiation-sensitive initiator compositions can comprise one or more diaryliodonium borate compounds. Representative iodonium borate compounds useful in this invention include but are not limited to, 4-octyloxy-phenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition. U.S. Pat. No. 8,043,787 (Hauck et al.) the disclosure of which is incorporated herein by reference with respect to useful initiator compositions, describes particularly diaryliodonium initiator compositions containing boron-containing anions.

Thus, in some embodiments, the initiator composition that is capable of generating free radicals upon exposure to imaging near-infrared radiation comprises a diaryliodonium cation and a boron-containing anion, wherein the diaryliodonium cation is represented by the following Structure (IV):

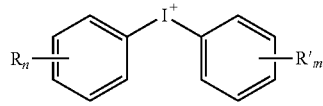

(IV)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5. The sum of m and n can be 1 to 6. The boron-containing anion is represented by the following Structure (V):

B⁻(R¹)(R²)(R³)(R⁴)  (V)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups, and the sum of m and n can be 1 to 6.

The amount of initiator composition in the negative-working imageable layer would be readily apparent to one skilled in the art and would be dependent upon the particular negative-working radiation-sensitive composition to be used, and the type and number of components in the initiator composition.

The negative-working radiation-sensitive composition and negative-working radiation-sensitive imageable layers can also comprise one or more radiation absorbers such as infrared radiation absorbers or one or more UV/violet sensitizers to provide desired imaging radiation sensitivity. The total amount of one or more radiation absorbers can be at least 0.5 weight % or at least 1 weight %, and up to and including 15 weight % or up to and including 30 weight %, based on the total weight of the negative-working radiation-sensitive imageable layer (or total solids of the corresponding coating formulation).

In some embodiments, the negative-working radiation-sensitive composition contains one or more UV, violet, or visible light sensitizers as radiation absorbers when the initiator composition is designed to have UV, violet, or visible radiation sensitivity (that is sensitivity to at least 250 nm and up to and including 550 nm), thereby facilitating photopolymerization. In other embodiments, the violet light sensitizers are sensitive to "violet" radiation in the range of at least 350 nm and up to and including 550 nm. Useful sensitizers for such compositions include certain pyrilium and thiopyrylium dyes and 3-ketocoumarins, as well as the HABI's described above. Some other useful sensitizers for such spectral sensitivity are described for example, in U.S. Pat. No. 6,908,726 (Korionoff et al.) and WO 2004/074929 (Baumann et al.) that describes useful bisoxazole derivatives and analogues, U.S. Pat. No. 7,527,916 (Callant et al.) and U.S. Pat. No. 8,445,176 (Venneman et al.), and U.S. Publication Numbers 2006/0063101 and 2006/0234155 (both Baumann et al.), the disclosures of all of which are incorporated herein by reference for these sensitizers.

Other useful UV-sensitive sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-sensitive radiation absorbers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Still other useful radiation absorbers for the violet region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure G-(Ar₁)₃ wherein $Ar_1$ is the same or different, substituted or unsubstituted carbocyclic aryl group having 6 to 12 carbon atoms in the ring, and G is a furan or oxazole ring, or the Structure G-(Ar₁)₂ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through R'$_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups), substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —N(R'$_4$)(R'$_5$) group, or a —OR'$_6$ group wherein R'$_4$ through R'$_6$ independently represent substituted or unsubstituted alkyl or aryl groups as defined above. At least one of R'$_1$ through R'$_3$ is an —N(R'$_4$)(R'$_5$) group wherein R'$_4$ and R'$_5$ are the same or different alkyl groups. Useful substituents for each Ar$_1$ group include the same or different primary, secondary, and tertiary amines.

Still another class of useful violet region radiation absorbers includes compounds represented by the Structure Ar$_1$-G-Ar$_2$ wherein Ar$_1$ and Ar$_2$ are the same or different substituted or unsubstituted aryl groups having 6 to 12 carbon atoms in the ring, or Ar$_2$ can be an arylene-G-Ar$_1$ or arylene-G-Ar$_2$ group, and G is a furan, oxazole, or oxadiazole ring. An is the same as defined above, and Ar$_2$ can be the same or different aryl group as Ar$_1$. "Arylene" can be any of the aryl groups defined for An but with a hydrogen atom removed to render them divalent in nature.

Some useful radiation absorbers are sensitive to both near-infrared radiation (typically of at least 700 nm and up to and including 1400 nm) and visible radiation (typically of at least 450 nm and up to and including 700 nm). These compounds can have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.), the disclosure of which is incorporated herein by reference.

In some embodiments of this invention, the method is carried out using a negative-working radiation-sensitive imageable layer that is sensitive (or sensitized) to near-infrared or infrared radiation having a wavelength of at least 750 nm. Some useful infrared radiation absorbers include but are not limited to, azo dyes, squarilium dyes, croconate dyes, triarylamine dyes, thiazolium dyes, indolium dyes, oxonol dyes, oxazolium dyes, cyanine dyes, merocyanine dyes, phthalocyanine dyes, indocyanine dyes, indotricarbocyanine dyes, oxatricarbocyanine dyes, thiocyanide dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrilo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squaraine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above), the disclosures of which U.S. patents are incorporated herein by reference. Infrared radiation absorbing N-alkylsulfate cyanine dyes are described for example in U.S. Pat. No. 7,018,775 (Tao) the disclosure of which is incorporated herein by reference. A general description of one class of suitable cyanine dyes is shown by the formula in paragraph [0026] of WO 2004/101280 (Munnelly et al.).

Near-infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.) the disclosures of which are incorporated herein by reference. Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are also described, for example, in U.S. Pat. No. 7,452,638 (Yu et al.), and U.S. Application Publications 2008/0254387 (Yu et al.), 2008/0311520 (Yu et al.), 2009/0263746 (Ray et al.), 2010/0021844 (Yu et al.), 2013/0758573 (Balbinot et al.), and 2014/0045118 (Balbinot et al.), the disclosures of which are incorporated herein by reference.

The negative-working radiation-sensitive imageable layer used in this invention can also include a poly(alkylene glycol) or an ether or ester thereof that has a molecular weight of at least 200 and up to and including 4000.

Optional additives to a negative-working radiation-sensitive imageable layer can include color developers or acidic compounds including but not limited to monomeric phenolic compounds, organic acids or metal salts thereof, oxybenzoic acid esters, acid clays, and other compounds described for example in U.S. Publication No. 2005/0170282 (Inno et al.). Also present can be a variety of other compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The negative-working imageable layer can also include a phosphate (meth)acrylate having a molecular weight generally greater than 250 as described in U.S. Pat. No. 7,429,445 (Munnelly et al.).

Non-Radiation-Sensitive Hydrophilic Overcoat

A negative-working lithographic printing plate precursor can have an outermost non-radiation-sensitive hydrophilic overcoat (or oxygen-barrier layer) disposed directly on the negative-working radiation-sensitive imageable layer for example disposed directly thereon (that is, no intermediate layers between these two layers). When present, this non-radiation-sensitive hydrophilic overcoat is generally the outermost layer of the precursor and thus, when stacked with other precursors, this non-radiation-sensitive hydrophilic overcoat of one precursor can be in contact with the backside of the substrate of the adjacent precursor above it if no interleaf is present.

Such non-radiation-sensitive hydrophilic overcoats can comprise one or more film-forming water-soluble polymeric binders in an amount of at least 60 weight % and up to and including 98 weight %, based on the total dry weight of the non-radiation-sensitive hydrophilic overcoat.

Such film-forming water-soluble (or hydrophilic) polymeric binders generally include a modified or unmodified poly(vinyl alcohol) having a saponification degree of at least 30%, or a degree of at least 75%, or a degree of at least 90%, and a degree of up to and including 99.9%.

For example, the non-radiation-sensitive hydrophilic overcoat can include one or more film-forming water-soluble polymeric binders that comprise at least one modified poly(vinyl alcohol) that is modified with at least 0.1 mol % of one or more of the same or different groups selected from the group consisting of carboxylic acid, sulfonic acid, acetoacetyl, alkylene, silanol, amino, thioalkyl, glycol, sulfuric acid ester, phosphonic acid, phosphoric acid ester, and glycol groups.

Further, one or more acid-modified poly(vinyl alcohol)s can be used as film-forming water-soluble (or hydrophilic) polymeric binders in the non-radiation-sensitive hydrophilic overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly(vinyl alcohol), carboxylic acid-modified poly(vinyl alcohol), and quaternary ammonium salt-modified poly(vinyl alcohol), glycol-modified poly(vinyl alcohol), or combinations thereof. Specific commercial examples of an acid-modified poly(vinyl alcohol) include Poval 3-86 SD and Poval 25-88 KL that are available from Kuraray, and Gohsenx L-3266, Gohsenx CKS-50, Gohsenx T-330H, T-330, and T-350 that are all available from Mitsubishi. Non-acid-modified poly(vinyl alcohol) products include Nichigo G Polymer and Gohsefimer K-210.

The non-radiation-sensitive hydrophilic overcoat can further comprise one or more other film-forming water-soluble polymers that are not poly(vinyl alcohol)s for example in an amount of at least 2 weight % and up to and including 40 weight %, of a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, vinyl acetate, and vinyl imidazole, and vinyl acetamide.

The non-radiation-sensitive hydrophilic overcoat formulations can also include cationic, anionic, amphoteric, or non-ionic wetting agents or surfactants, flow improvers or thickeners, antifoamants, colorants, and biocides. Details about such addenda and useful amounts are provided in WO 99/06890 (Pappas et al.), EP 1,788,429 (Loccufier et al.), and U.S. Publication Numbers 2005/0266349 (Van Damme et al.), 2007/0231739 (Koizumi), 2007/0231740 (Yanaka et al.), and 2011/0053085 (Huang et al.).

The non-radiation-sensitive hydrophilic overcoat can be generally present at a dry coating coverage of at least 0.1 $g/m^2$ and up to but less than 4 $g/m^2$, and typically at a dry coating coverage of at least 0.15 $g/m^2$ and up to and including 2.5 $g/m^2$. In some embodiments, the dry coating coverage is at least 0.1 $g/m^2$ and up to and including 1.5 $g/m^2$ or at least 0.1 $g/m^2$ and up to and including 0.9 $g/m^2$, such that the non-radiation-sensitive hydrophilic overcoat layer is relatively thin for easier removal during off-press development when a separate prewash step is used after imagewise exposure.

The non-radiation-sensitive hydrophilic overcoat can optionally comprise organic wax particles dispersed, generally uniformly, within the one or more film-forming water-soluble (or hydrophilic) polymeric binders as described for example in U.S. Published Application 2013/0323643 (Balbinot et al.), the disclosure of which is incorporated herein by reference. These organic wax particles are generally present in an amount of at least 0.05 weight % and up to and including 20 weight %, or in an amount of at least 0.5 weight % and up to and including 10 weight %, all based on the total dry non-radiation-sensitive hydrophilic overcoat weight. Useful organic wax particles can be prepared using known procedures as described for example, in WO96/010599 (Soler Codina). Some useful fluorinated and non-fluorinated hydrocarbon wax particles can also be purchased from a number of commercial sources such as Mitsui Chemical Inc. or Munzing Liquid Technologies GmbH.

Negative-Working Lithographic Printing Plate Precursors

The negative-working radiation-sensitive compositions described above can be applied to a substrate as described above as a solution or dispersion in a coating liquid using any suitable equipment and procedure, such as spin coating, knife coating, gravure coating, die coating, slot coating, bar coating, wire rod coating, roller coating, or extrusion hopper coating. They can also be applied by spraying onto a suitable substrate. Typically, the negative-working radiation-sensitive composition is applied and dried to form a negative-working radiation-sensitive imageable layer.

Illustrative of such manufacturing methods is mixing the various components needed for the radiation-sensitive imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and negative-working radiation-sensitive imageable layer formulations are described in the Examples below. After proper drying, the coating weight of the negative-working radiation-sensitive imageable layer is generally at least 0.1 $g/m^2$ and up to and including 5 $g/m^2$ or at least 0.5 $g/m^2$ and up to and including 3.5 $g/m^2$.

Distinct non-imageable layers can also be present under the negative-working radiation-sensitive imageable layer to enhance developability or to act as thermal insulating layers.

Optionally, a suitable non-radiation-sensitive hydrophilic overcoat layer formulation (as described above) can be applied to a dried negative-working radiation-sensitive imageable layer in a suitable manner, generally out of an aqueous solvent, and then dried as described below.

Once the various layers have been applied and dried on the substrate, the negative-working lithographic printing plate precursors can be enclosed in water-impermeable material that substantially inhibits the transfer of moisture to and from the element and "heat conditioned" as described in U.S. Pat. No. 7,175,969 (noted above).

The lithographic printing plate precursors can be stored and transported as stacks of precursors within suitable packaging and containers known in the art, and interleaf papers can be present between the adjacent precursors in the stacks, or in some embodiments, such interleaf papers can be omitted.

In some embodiments of the inventive method, the lithographic printing plate precursor is a negative-working lithographic printing plate precursor comprising a negative-working radiation-sensitive imageable layer that is sensitized to: near-infrared or infrared radiation having a wavelength of at least 750 nm; or to UV or visible radiation having a wavelength of at least 250 nm and up to and including 550 nm.

In more specific embodiments, the inventive method is directed to imagewise exposing and processing a lithographic printing plate precursor that is a negative-working lithographic printing plate precursor comprising a negative-working radiation-sensitive imageable layer that is sensitized to UV or visible radiation having a wavelength of at least 250 nm and up to and including 550 nm.

Positive-Working Lithographic Printing Plate Precursors

Positive-working lithographic printing plate precursors that can be used in the method of the present invention can comprise one or more radiation-sensitive imageable layers disposed on a suitable substrate having a hydrophilic surface. Such precursors can have a single radiation-sensitive imageable layer along with optional underlying layers that are non-radiation-sensitive, or they can have two or more radiation-sensitive imageable layers (sometimes known as innermost and outermost radiation sensitive layers or "ink-receptive" layers) along with optional underlayers and intermediate layers. Such radiation-sensitive imageable layers are typically "sensitive" to near-infrared radiation exposure as defined herein, and such exposure makes exposed regions of such layers more soluble or dispersible in the processing solution according to the present invention, so that the chemical materials in such regions can be readily removed during processing (development).

The chemical compositions and useful components of the various radiation-sensitive imageable layers for such precursors, and means for making the precursors, are well known from considerable patent literature including, but not limited to, U.S. Pat. No. 8,088,549 (Levanon et al.), U.S. Pat. No. 8,530,143 (Levanon et al.), and U.S. Pat. No. 8,936,899 (Hauck et al.), and U.S. Patent Application Publications 2012/0270152 (Hauck et al.) and 2017/0068164 (Huang et al.), the disclosures of all of which are incorporated herein by reference with respect to the composition and formation of positive-working lithographic printing plate precursors.

Imaging Conditions

During use, a negative-working lithographic printing plate precursor can be exposed to a suitable source of exposing radiation depending upon the radiation absorber present in the negative-working radiation-sensitive composition to provide specific sensitivity that is at a wavelength of at least 250 nm and up to and including 550 nm ("UV," "violet," and "visible" regions of the electromagnetic spectrum) or near-infrared of at least 750 nm and up to and including 1400 nm. In some embodiments, imagewise exposure is carried out using radiation having a $\lambda_{max}$ within the range of at least 250 nm and up to and including 550 nm when the negative-working lithographic printing plate precursor is sensitive to UV or "violet" imaging radiation, or by using near-IR radiation having a $\lambda_{max}$ within the range of at least 750 nm and up to and including 1400 nm using an appropriate energy source when the lithographic printing plate precursor is sensitive (or sensitized) to near-infrared radiation.

Thus, in some embodiments, the method of this invention utilizes a negative-working lithographic printing plate precursor that is sensitive to near-infrared radiation and it is imagewise exposed using near-infrared radiation at a wavelength of at least 750 nm and up to and including 1400 nm.

In other embodiments, the method of this invention utilizes a negative-working lithographic printing plate precursor that is sensitive to radiation having a wavelength of at least 250 nm and up to and including 550 nm, and it can be imagewise exposed using radiation at a wavelength of at least 250 nm and up to and including 550 nm.

In still other embodiments, the method of this invention utilizes a positive-working lithographic printing plate precursor that is sensitive to near-infrared radiation and it can be imagewise exposed using near-infrared radiation at a wavelength of at least 750 and up to and including 1400 nm.

Imaging of a particular precursor can be carried out using imaging or exposing radiation from a radiation-generating laser (or array of such lasers). Imaging also can be carried out using imaging radiation at multiple wavelengths at the same time if desired. The laser used to expose the lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the lithographic printing plate precursor mounted to the interior or exterior cylindrical surface of the drum. An example of a useful imaging apparatus is available as models of KODAK® Trendsetter platesetters available from Eastman Kodak Company that contain laser diodes that emit near-infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with near-infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the imageable layer. With these platesetters, any imaging parameters such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using such a stepwise imaged lithographic printing plate precursor, a shortened printing run is possible and the obtained prints are also useful for determining such imaging parameters.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and ANDROMEDA® A750M (from Lithotech, Germany), imagesetters.

Imaging radiation in the UV to visible region of the spectrum, and particularly the UV or violet region (for example at least 250 nm and up to and including 550 nm), can be carried out generally using energies of at least 0.01 mJ/cm$^2$ and up to and including 0.5 mJ/cm$^2$, and typically at least 0.02 mJ/cm$^2$ and up to and including about 0.1 mJ/cm$^2$. It would be desirable, for example, to image the UV/violet radiation-sensitive precursors at a power density in the range of at least 0.5 kW/cm$^2$ and up to and including 50 kW/cm$^2$ and typically of at least 5 kW/cm' and up to and including 30 kW/cm$^2$, depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Processing and Printing

After imagewise exposing, the imagewise exposed negative-working lithographic printing plate precursors is processed "off-press" using one or more successive applications (treatments or developing steps) of the processing solution according to this invention as described below. The term "successive" means that there are no intermediate rinsing steps between two distinct (independent) processing applications (or treatments), but if desired, there can be an intermediate step of removing the processing solution from the precursor between any two successive applications of the processing solution. Such one or more successive processing treatments (for example, two successive processing treatments) are carried out with imagewise exposed negative-working precursors for a time sufficient to remove the non-exposed regions of the imaged negative-working radiation-sensitive imageable layer and the outermost non-radiation-sensitive hydrophilic overcoat, if present, to reveal the hydrophilic surface of the substrate, but not long enough to remove significant amounts of the exposed regions that have been hardened. The revealed hydrophilic substrate surface repels inks while the exposed regions accept lithographic printing ink. Thus, the non-exposed regions to be removed are "soluble" or "removable" in the processing solution because they are removed, dissolved, or dispersed within it more readily than the regions that are to remain. The term "soluble" can also mean "dispersible."

For the embodiments in which positive-working lithographic printing plate precursors are used in the invention, the precursor is suitably exposed with imaging radiation so that the exposed regions of the one or more positive-working radiation-sensitive imageable layers in the imagewise exposed positive-working precursor are softened or solubilized so they can be removed during development with one or more successive treatments with the processing solution to reveal the hydrophilic surface of the substrate, without removing significant amounts of the non-exposed regions on the substrate.

Prior to such processing (development), the imagewise exposed precursors can be subjected to a "pre-heating" process to further harden the exposed regions in a negative-working radiation-sensitive imageable layer. Such optional pre-heating step can be carried out using any known process or equipment and is generally at a temperature of at least 60° C. and up to and including 180° C.

Following this optional pre-heating step, or in place of the pre-heating step, the imagewise exposed precursor can be washed (rinsed) to remove any non-radiation-sensitive hydrophilic overcoat that is present. Such optional washing (or rinsing) can be carried out using any suitable aqueous solution (such as merely water or an aqueous solution of a surfactant) at a suitable temperature and time that would be readily apparent to one skilled in the art.

One or more successive treatments with the processing solution according to this invention off-press can be accomplished using what is known as "manual" development, "dip" development, or processing with an automatic development apparatus (processor) using one or more processing stations. In the case of "manual" development, processing can be conducted by rubbing the entire imagewise exposed precursor with a sponge or cotton pad sufficiently impregnated with the processing solution (as described below).

"Dip" development involves dipping the imagewise exposed precursor in a tank or tray containing a processing solution for at least 10 seconds and up to and including 60 seconds (especially at least 20 seconds and up to and including 40 seconds) under agitation. The use of automatic development apparatus is well known and generally includes pumping a processing solution into a developing tank or ejecting it from spray nozzles. The apparatus can also include a suitable mechanical rubbing mechanism (for example one or more brushes, rollers, or squeegees) and a suitable number of conveyance rollers. Some developing apparatus includes laser exposure means and the apparatus is divided into an imaging section and one or more processing sections. Manual processing is less desirable than the use of a processing apparatus of some type.

Thus, an inventive processing solution (usually, at working strength) can be applied in one or more successive applications to an imagewise exposed precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the imagewise exposed precursor with the processing solution or by contacting it with a roller, impregnated pad, or applicator. For example, the imagewise exposed precursor can be brushed with one or more successive treatments or applications of the inventive processing solution, or an inventive processing solution can be successively poured onto or applied by spraying the imagewise exposed precursor surface with sufficient force to remove the non-exposed or exposed regions using a spray nozzle system (or spray bar) as described for example in [0124] of EP 1,788,431A2 (noted above) and U.S. Pat. No. 6,992,688 (Shimazu et al.) the disclosure of which is incorporated herein by reference. As noted above, the imagewise exposed precursor can be immersed in one or more successive baths of an inventive processing solution and rubbed by hand or with an apparatus. To assist in the removal of any back side coating, a brush roller or other mechanical component can be placed in contact with the back side coating during processing.

The inventive processing solution can be successively applied to the imagewise exposed precursor in one or more successive processing units (or stations) of a suitable processing apparatus ("processor") that has at least one brush roller for rubbing or brushing the imagewise exposed precursor. Residual processing solution can be removed for example, using a squeegee or nip rollers, or left on the resulting lithographic printing plate without any rinsing step. Excess amounts of inventive processing solution can be collected in a tank and used several times, and replenished if necessary, from a reservoir.

The inventive processing solution can be replenished using any suitable means and at a desired time. In the case of dip tank and spray bar arrangements in processing apparatus, the inventive processing solution can be replenished with replenisher having the same concentration of the original inventive processing solution. It is also possible to replenish the inventive processing solution with a more concentrated or more dilute form (for example, diluted with water) of the processing solution. Another option is to replenish the processing solution with water. The chosen method of replenishment depends upon the type of imagewise exposed precursor to be processed, the chosen inventive processing solution (for example, specific compounds represented by Structure (I), chosen buffer capacity, solids content, viscosity, and other properties), and the construction of the processing apparatus (for example, amount of evaporation in a given processing mode or use of preheating).

One or multiple (for example two) successive processing steps can be carried out at any suitable temperature and "dwell time" (time of contact with the inventive processing solution in one or more processing stations). For example, the imagewise exposed precursor can be contacted with a processing solution according to this invention, each individual (distinct) application or contact being carried out independently at a temperature of at least 20° C. and up to and including 40° C. Each individual contacting or treatment can be carried out, for example, in a dip tank or spray bar processor at a temperature of at least 20° C. and up to and including 40° C. optionally while using at least one rotating brush in each processing station.

It is useful to carry out each of multiple successive treatments or applications (for example two successive applications) of the inventive processing solution to the imagewise exposed precursor in a dip tank arrangement (for example, arranged with 1 to 3 mechanical brush rollers), using of a spray bar arrangement (for example, arranged with 1 to 3 mechanical brush rollers), or by applying an inventive processing solution using contact with rubber rollers without brush rollers. Hot air drying can be used after the last application of inventive processing solution before being mounting the lithographic printing plate onto a printing press.

For example, in some embodiments, a first application of inventive processing solution can be carried out in a dip tank arrangement (for example, arranged with 1 to 3 mechanical brush rollers) followed by a second application of the same or different inventive processing solution using a rubber roller without brush rollers.

When a single application of inventive processing solution is used in some embodiments of the present invention, it can be applied in a dip tank arrangement (for example, arranged with 1 to 3 mechanical brush rollers), using of a spray bar arrangement (for example, arranged with 1 to 3 mechanical brush rollers), or by applying it using contact with rubber rollers without brush rollers. Hot air drying can be used after this single application of inventive processing solution before mounting the resulting lithographic printing plate onto a printing press.

Working Strength Inventive Processing Solution and Processing Solution Concentrate:

By "working strength," it is meant that the inventive processing solution is ready for use for processing (development) without significant dilution or concentration. A skilled worker would know how to adjust concentrations, pH, and % non-volatiles to have working strength characteristics for a given processing apparatus and method arrangement. Unless otherwise indicated below in this section, the term "processing solution" will refer to the working strength compositions used during processing.

Both the working strength processing solution and processing solution concentrate of the present invention generally has a pH of at least 2, and particular at least 2 and up to and including 13.7, or at least 2 and up to and including 11, or at least 6 and up to and including 11 for some embodiments. A skilled worker would understand what pH is optimal for specific types of lithographic printing plate precursors used in the method, and the inventive processing solution pH can be adjusted using suitable acids and bases, and maintained using appropriate buffers. For example, processing exposed positive-working precursors would best be done with an inventive processing solution having a pH of at least 9 and up to and including 13.7, while processing exposed negative-working precursors would best be done with an inventive processing solution having a pH of at least 4 and up to and including 11.

The essential component of the processing solution(s) and processing solution concentrates used in the practice of this invention is one or more "amide" compounds represented by Structure (I):

$$R^1-C(=O)-N(R^2)-R^3 \qquad (I)$$

wherein $R^1$, $R^2$, and $R^3$ independently represent hydrogen or a substituted or unsubstituted hydrocarbon group, or two or three of $R^1$, $R^2$, and $R^3$ are combined to form one or more cyclic rings. In general, the unsubstituted hydrocarbon group can be a saturated or unsaturated, linear or branched, moiety that is composed solely of hydrogen and carbon atoms in unsubstituted form. If substituted, the hydrocarbon group can carry various common substituents such as a hydroxyl, chloro, bromo, fluoro, alkoxy, alkoxycarbonyl, acyloxy, amido, or phenoxy group. The total number of carbon atoms in $R^1$, $R^2$, and $R^3$, in combination with the carbonyl carbon in Structure (I) must be at least 7 and up to and including 33 in the Structure (I) molecule, or at least 8 and up to and including 22 in the Structure (I) molecule. The compounds represented by Structure (I) useful in the present invention are not considered polymeric because of their relatively low molecular weight. However, the compounds represented by Structure (I) can have multiple "amide" (or "amido") groups including the one shown specifically in Structure (I). The compounds represented by Structure (I) are not charged, that is, they have no positive or negative ionic charges.

Moreover, any two or all three of $R^1$, $R^2$, and $R^3$ can be combined with each other to form one or more cyclic rings, such as two or more fused rings. Such cyclic rings can be "saturated" or "unsaturated," meaning that there can be one or more carbon-carbon double bonds forming the chain of carbon atoms in the cyclic ring. Such cyclic rings can also be substituted with one or more substituents including those described above for the substituted hydrocarbon groups.

There are numerous compounds within the scope of Structure (I) which can be used in the practice of this invention, including but not limited to those selected from the group consisting of:

N-octylpyrrolidone, N-cyclohexylpyrrolidone, N-phenylpyrrolidone, N-benzyl-2-pyrrolidinone, 1-(3-hydroxypropyl)-2-pyrrolidone, N-decylpyrrolidone, N-laurylpyrrolidone, N,N-dimethyloctylamide, N,N-dimethyldecylamide, N,N-dimethyldeceneamide, N,N-dimethylundeceneamide, 5-dimethylamino-2-methyl-5-oxopentanoic acid methyl ester, N,N-diethyldodecylamide, N,N-diethyldecylamide, N,N-diethylhexadecylamide, N,N-dimethylhexadecylamide, N,N-dimethylheptylamide, N,N-dimethyloctadecylamide, N,N-dimethyl-5,8,11,14-eicosatetraenamide, N,N-dimethyl-(2E,4E)-2,4-hexadienamide, N,N-diethyl-5-methyl-3-octenamide, N-methyl-N-octylacetamide, N,N-diethylundecylamide, N,N-bis(1-methylethyl)-octylamide, N,N-bis(1-methylethyl)-nonylamide, N,N-2-triethylhexylamide, and N,N-diethyl-(9Z)-9-octadecenamide, lauramide DEA.

Other useful compounds are listed within the teaching of [0038], , [0041], [0043], [0044] of EP 2,632,256B1 (Stepan Company); Col. 1 (line 42) to Col. 5 (line 5) of U.S. Pat. No. 5,294,644 (Login et al.), the disclosure that is incorporated herein by reference for these compounds; and [0017]-[0018], [0027]-, and [0035]-[0036] of WO 2013/019866 (Rhodia Operations), as long as the compounds also meet the definitions for Structure (I) noted above. Compounds described in these teachings can be readily screened and determined using routine experimentation to be useful or not in the practice of this invention, including the various processing tests described below in the working Examples.

Mixtures of Structure (I) compounds can be used if desired, and such mixtures can be readily determined using routine experimentation.

Moreover, if successive applications of a processing solution are carried out, the inventive processing solution used in each application can be the same or different from that used in one or all of the other applications. This "difference" can be in the compounds of Structure (I) used (that is, different one or more compounds), or the same Structure (I) compounds can be used but at different concentrations. In some embodiments, the same Structure (I) compounds are used in successive applications, but the Structure (I) compounds used in the inventive processing solutions are present at different concentrations where one inventive processing solution is more diluted (for example, with water) than other inventive processing solution.

The amount of Structure (I) compounds used in any of the inventive processing solution(s) can be at least 0.1 weight %, and up to and including 10 weight %, or at least 0.2 weight % and up to and including 5 weight %, or even at least 0.5 weight % and up to and including 4 weight %, all based on the total weight of the inventive processing solution, including water and any liquid organic solvents.

For the inventive processing solution concentrates according to this invention, the amount of Structure (I) compounds present can be at least 0.2 weight %, and up to and including 30 weight %, or at least 0.5 weight % and up to and including 25 weight %, or even at least 1.0 weight % and up to and including 20 weight %, all based on the total weight of the inventive processing solution concentrate, including water and any liquid organic solvents.

The working-strength inventive processing solutions according to this invention generally have a % non-volatiles of at least 1% or at least 5% and up to and including 10%, or up to and including 15%. The % non-volatiles can be changed at any time during development, for example by dilution with water. For the inventive processing solution concentrates according to the present invention, the % non-volatiles is generally at least 3% and up to and including 45%, or more likely at least 6% and up to and including 35%.

While the compound(s) represented by Structure (I) are essential to achieve the development results described for this invention, the processing solution can optionally include one or more of the following four components, identified herein as component (1), component (2), component (3), and component (4) all of which are different from the one or more compounds represented by Structure (I). The order of importance for the presence of these optional components is that the presence of components (1) or (2) is more desirable than the presence of component (4) the presence of which is more desirable than the presence of component (3).

These components (1) through (4) can be defined more particularly as follows:

Component (1):

As noted above, component (1) is a pH buffer composition. The main purpose of the pH buffer composition is to set the pH value of the processing solution to a desired value. For this purpose, common pH buffers that are well known in the art can be used. For some embodiments, the pH buffer composition can be just one or more alkaline materials such as sodium hydroxide, potassium hydroxide, sodium carbonate, sodium bicarbonate, sodium citrate, and organic amines. Examples for suitable pH buffer compositions include, but are not limited to, solid amines such as those described in U.S. Pat. No. 9,329,485 (noted above). Other useful buffer compositions can be derived from, but are not limited to, any combination of one or more weak acids, such as for example carbonic acid, carboxylic acid, phosphoric acid, organic ammonium compounds, and their conjugate bases, such as carbonates, carboxylates, phosphates, and organic amines.

The one or more component (1) compounds can be present in the processing solution in an amount of at least 0.1 weight %, and more likely in an amount of at least 1 weight % and up to and including 10 weight %, based on the total weight of the processing solution. For processing solution concentrates, component (1) can be present in an amount of at least 0.2 weight % and up to and including 15 weight %, based on the total weight of the processing solution concentrate.

Component (2):

Component (2) comprises a surfactant composition that generally comprises one or more of non-ionic, anionic, cationic or amphoteric surfactants. The surfactant composition is not specifically limited as long as it is compatible with the other components of the processing solution. Examples of non-ionic surfactants include, but not limited to, those described in U.S. Pat. No. 9,329,485 (noted above). Other suitable examples of the nonionic surfactants include polyoxyethylene alkyl ethers, polyoxyethylene phenyl ethers, polyoxyethylene 2-naphthyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerin and aliphatic acids, partial esters of sorbitan and aliphatic acids, partial esters of pentaerythritol and aliphatic acids, propyleneglycolmonoaliphatic esters, partial esters of sucrose and aliphatic acids, partial esters of polyoxyethylenesorbitan and aliphatic acids, partial esters of polyoxyethylenesorbitol and aliphatic acids, polyethyleneglycol aliphatic esters, partial esters of poly-glycerin and aliphatic acids, polyoxyethylenated castor oils, partial esters of polyoxyethyleneglycerin and aliphatic acids, N,N-bis-2-hydroxyalkylamines, polyoxyethylene alkylamines, triethanolamine aliphatic esters, and trialkylamine oxides. Further, fluorinic and siliconic anionic and nonionic surfactants can be similarly used.

Examples of anionic surfactants include hydroxyalkanesulfonates, alkyl sulfonates, dialkylsulfosuccinates, straight-chain alkylbenzenesulfonates, branched alkylbenzenesulfonates, alkylnaphthalenesulfonates, alkylphenoxypolyoxyethylenepropyl sulfonates, salts of polyoxyethylene alkylsulfophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylesters, salts of alkylsulfuric esters, sulfuric esters of polyoxyethylenealkylethers, salts of sulfuric esters of aliphatic monoglycerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene/maleic anhydride copolymers, partially saponified compounds of olefin-maleic anhydride copolymers, naphthalenesulfonate/formalin condensates, sodium dodecylphenoxybenzene disulfonates, the sodium salts of alkylated naphthalenesulfonate, disodium methylene-dinaphthalene-disulfonate, sodium dodecyl-benzenesulfonate, (di)sulfonated alkyldiphenyloxides, ammonium or potassium perfluoroalkylsulfonates and sodium dioctyl-sulfosuccinate.

Amphoteric surfactants are for example N-alkylamino acid triethanol ammonium salts, cocamidopropyl betaines, cocamidoalkyl glycinates, sodium salt of a short chain alkylaminocarboxylate, N-2-hydroxyethyl-N carboxyethyl fatty acid amidoethylamine sodium salts, and carboxylic acid amidoetherpropionates.

Examples of cationic surfactants are tetraalkylammonium chlorides like tetrabutylammonium chloride and tetramethylammonium chloride, and polypropoxylated quaternary ammonium chlorides.

Component (2) can be generally present in the processing solution in an amount of at least 0.1 weight % and up to and including 10 weight %, based on total processing solution weight. For processing solution concentrates, component (2) can be present in an amount of at least 0.2 weight % and up to and including 15 weight %, based on the total weight of the processing solution concentrate.

Component (3):

Component (3) is a solution promoter, sometimes also referred to as a hydrotrope or organic solvent. Solution promoters are not specifically limited as long as they are compatible with the other components of the processing solution.

One or more of these (3) solution promoters can be present in the processing solution in a total amount of at least 0.1 weight % and up to and including 5 weight %, based on the total processing solution weight. For processing solution concentrates, component (3) can be present in an amount of at least 0.2 weight % and up to and including 10 weight %, based on the total weight of the processing solution concentrate.

Such solution promoters can include, but are not limited to, those described in U.S. Pat. No. 9,329,485 (noted above). Useful solution promoters include, but are not limited to, salts of phosphoric acid esters, ethoxylated quaternary fatty amines, alkyl glycosides, alkylamino dipropionate, complex coconut acid iminoglycinates, complex coconut acid iminodipropionates, alkanol polyglycol phosphoric acid alkylester, and alkali salts of arylsulfonic acid.

Other examples of useful (3) solution promotors can be cyclohexanone, acetone, methyl ethyl ketone, ethyl butyl ketone, methyl isobutyl ketone, diester phthalates (e.g., dibutyl phthalate, diheptyl phthalate, di-n-octyl phthalate, di(2-ethylhexyl) phthalate, dinonyl phthalate, didecyl phthalate, dilauryl phthalate, butylbenzyl phthalate), aliphatic dibasic esters (for example, dioctyl adipate, butylglycyl adipate, dioctyl acetate, dibutyl sebacate, di(2-ethylhexyl) sebacate, di(octyl sebacate), ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, or butyl levulinate, and others (for example, triethyl phosphate, tricresyl phosphate, N-phenylethanolamine, or N-phenyldiethanolamine).

Component (4):

Another useful optional material in the processing solution is component (4) that is a hydrophilic surface protective composition comprising one or more hydrophilic surface protective compounds to protect the non-imaged regions of the exposed and processed precursor before it is used for lithographic printing. Component (4) can be selected from, for example, polysaccharides, modified starches, (such as etherized, extended structure, and oxidized starches, crosslinked starches, and graft-polymerized starches), gum arabic, dextrin (such as enzyme-modified dextrins), cellulose derivatives (for example, carboxymethyl cellulose, carboxyethyl cellulose, and methyl cellulose), pullulan, a poly(vinyl alcohol), a poly(vinyl pyrrolidone), a poly(meth)acrylamide, poly(meth)acrylic acid, a vinyl methyl ether/maleic anhydride copolymer, a vinyl acetate/maleic anhydride copolymer, a styrene/maleic anhydride copolymer, and a hydroxycarboxylate salt.

In some embodiments, component (4) can have an acid value of 0 and up to and including 3 meq KOH/gram of component (4) wherein acid value is determined using known procedures.

Useful enzyme-modified dextrins include enzymatically produced dextrin and Schardinger dextrin.

Modified starches include for example, corn, potato, tapioca, rice, wheat, and other known starches that can be modified using known procedures and an acid or enzyme to provide roasted starches such as British gum. Useful oxidized starches include solubilised starch, pre-gelatinized starches such as modified pre-gelatinized starch and unmodified pre-gelatinized starch. Useful esterified starches include starch phosphate, fatty starch, starch sulfate, starch nitrate, starch xanthate, and starch carbamate. Useful etherized starches include carboxyalkyl starch, hydroxyalkyl starch, sulfoalkyl starch, cyanoethyl starch, allyl starch, benzyl starch, carbamylethyl starch, and dialkylamino starch. Useful crosslinked starches include methylol-crosslinked starch, hydroxyalkyl-crosslinked starch, phosphate-crosslinked starch, and dicarboxylic acid-crosslinked starch. Useful graft polymerized starches include starch/polyacrylamide copolymers, starch/polyacrylic acid copolymers, starch/polyvinyl acetate copolymers, starch/polyacrylonitrile copolymers, cationic starch/polyacrylate ester copolymers, cationic starch/vinyl polymer copolymers, starch/polystyrene/maleic acid copolymers, starch/polyethylene oxide copolymers, and starch/polypropylene copolymers.

Furthermore, hydroxycarboxylate salts such as those as disclosed in EP 2,354,852A1 can be used.

The (4) hydrophilic surface protective composition can be in the processing solution in an amount of at least 0.1 weight % and up to and including 10 weight %, based on the total processing solution weight. For processing solution concentrates, component (4) can be present in an amount of at least 0.2 weight % and up to and including 15 weight %, based on the total weight of the processing solution concentrate.

The processing solution (and processing solution concentrate) according to the present invention can also optionally include chelating agents (such as salts of ethylenediaminetetraacetic acid), antifoaming agents, biocides, sludge inhibitors (such as filter dyes and free-radical inhibitors), anti-corrosion agents, and dyes. Such optional components can be present in amounts that would be readily apparent to one skilled in the lithographic processing art.

Tap water, deionized water, or distilled water can be used to make up the processing solution and generally provides at least 45 weight % and up to and including 98 weight % of the total processing solution weight or processing solution concentrate weight.

Application(s) of Processing Solution:

The processing solution can be applied in each of the one or more successive applications manually or within automated processing machines of dip tank or spray-bar type processor, each at a temperature of at least 20° C. and up to and including 40° C., and optionally while using at least one rotating brush. The purpose of any processing solution application is the removal of non-imaged regions of an exposed printing plate precursor. The non-imaged regions refer to the regions of the imageable layer(s) in the lithographic printing plate precursors that correspond to the non-ink-receptive regions of the resulting lithographic printing plates. For example, the processing solution can be applied within automated equipment and used up to the limit of developer capacity beyond which the resulting lithographic printing plates are no longer acceptably clean, or the processing equipment can no longer be cleaned easily. Typically, developer capacity is defined in terms of square meters of lithographic printing plate precursors per liter of processing solution.

In any automated processing step, depending on the type of the processing machine used, a minimum volume must be maintained to keep the machine working. The processing machine can comprise a closed loop of the processing solution, with or without circulation, where the concentration of the imageable layer(s) components within the processing solution increases as the number of imagewise exposed and processed precursors increases. The processing machine can also comprise an open system ("top up" system) where fresh processing solution is constantly or intermittently added and a portion of used (or seasoned) processing solution is removed from the top via an overflow mechanism connected to a drain or a waste collector. With the top up system, the concentration of imageable layer(s) components will eventually reach a steady-state when fresh processing solution is added at a constant rate (known as the "top up rate"). The top up rate is not specifically limited but desirably chosen in such a way that the overall consumption of processing solution in liter/m$^2$ of printing plate precursors matches the desired developer capacity in m$^2$/liter. The replenishment solution added into the top up system can be water, fresh processing solution, processing solution concentrate, or a combination of two of such liquids that can be mixed manually or automatically in the processing machine.

In some embodiments, the optionally preheated and optionally rinsed imagewise exposed precursor can be developed within a single application or step, in a one-bath processor or in "clean out" units having a single set of spray bars, desirably in combination with the use of rotating brushes. Excess processing solution can be mechanically removed from the resulting lithographic printing plates using squeegee rollers, and the lithographic printing plates are optionally dried before being mounted onto a printing press.

In embodiments in which two or more successive applications of the processing solution are used, for example, when there are two successive applications of the processing solution, each application can be carried out with a processing solution having the essential one or more compounds represented by Structure (I), but the specific amide compounds or the concentration of one or more of these amide compounds can be the same or different between successive applications of processing solutions. Moreover, the specific chemical compounds or amounts of any of components (1) through (4), if present, can be the same or different in the processing solutions used in the successive processing applications.

It is possible, for example, to have successive applications of processing solution wherein there is a steady reduction in one or more compounds represented by Structure (I) in later applications compared to the immediately preceding application of processing solution.

In some embodiments, an automatic processing apparatus used for the processing of the imagewise exposed precursors comprises a development section and a gum section separate from the development section. In such embodiments, the processing solution of the first section is typically used to treat a plurality of imagewise exposed precursors that were optionally preheated and optionally rinsed before processing to remove the non-imaged regions of the imageable layer(s) of the exposed precursors. In such cases, it is desirable for excess processing solution to be removed mechanically from the lithographic printing plate between the at least two successive applications of the same or different processing solution, by squeegee rollers, and optionally, but not preferably, a water rinse is carried out, before the printing plate precursor is further treated by a gumming (or finishing) solution to protect the hydrophilicity of the aluminum substrate from damage before the printing plate is mounted onto a printing press. The gumming or finishing solution is not specifically limited, but can be composed of the same components including the compounds represented by Structure (I) and optional components (1) to (4) as the processing solution applied in the developer section. The concentration of components represented by Structure (I) and optional components (1) to (4) in the gumming solution and in the processing solution applied in the development section can be the same or different. In some embodiments, it is desired that the concentration of all components in the gumming solution is lower than the concentration in the processing solution used in the development section.

In yet another embodiment, it is also possible to process imagewise exposed precursors following a cascade principle. Examples of cascade processing systems include those described in U.S. Pat. No. 9,156,529 (Vervloet et al.) and U.S. Pat. No. 9,354,520 (Hendrix et al.), the disclosures of which are incorporated herein by reference. In such embodiments, the imagewise exposed and optionally preheated and optionally rinsed precursors are processed in a first development section. After optional mechanical removal of excess processing solution, a partially developed printing plate precursor can be further processed in a second development section. An arbitrary number of such cascaded processing steps can be carried out. For example, two consecutive processing steps (two consecutive applications) can be carried out before the lithographic printing plate is further treated with a gumming solution. In a cascading system with two or more development sections, fresh processing solution can usually be added to the last development section. Each of the development sections has an overflow mechanism to transfer partially loaded processing solution to the proceeding development section up to the first development section. The first development section can have an overflow mechanism to remove loaded (or seasoned) processing solution to a drain or a waste collector. The replenishing solution added to the last development section is desirably a mixture of water and a processing solution concentrate. After optional mechanical removal of excess processing solution or finishing solution, the lithographic printing plate is optionally dried by thermal treatment and optionally irradiated using a suitable light source such as a UV LED light.

Each application of processing solution, including the multiple successive applications can be carried out using the same or different apparatus, processing tanks, brushes, temperature, and dwell time as described above, but in many instances, the processing apparatus, technique, temperature, and dwell time are similar for each application of processing solution.

There can be a drying process between each two successive applications, and drying conditions can be the same or different from those described below that is carried out after the last application of processing solution. However, such drying procedures between successive applications are not required. Moreover, excess processing solution can be removed from the imagewise exposed precursor between the two successive applications of processing solution using known means such as a mechanical means including a squeegee roller or blown air.

As a skilled worker in the art would appreciate, the method of this invention can include one or more optional steps that may enhance development depending upon the type of lithographic printing plate precursor being used. For example, it is sometimes desirable to heat the imagewise exposed precursor (step ($A_1$) prior to processing in step (B)). This heating can be carried out in a pre-heating unit using conventional apparatus and heating means for example at a temperature of 150° C. or less.

Post-Processing Operations:

It is optional but desirable in some embodiments that the exposed and processed precursor is dried before it is mounted on a printing press. Drying can be accomplished using any suitable method and drying means such as using blown hot air at a temperature of at least 40° C. and up to and including 150° C., or a drying oven maintained at a suitable temperature, or by irradiation with a suitable light source such as a UV LED light. Different methods can also be combined in a suitable manner, for example, the processed printing plate can be dried by blown hot air of at least 40° C., and then additional drying by a suitable light source such as UV LED can be carried out. The drying means can be a distinct section or station in a processing apparatus, or it can be a separate apparatus.

After step (B) processing the imagewise exposed precursor, as noted above, a gumming solution can be applied to the lithographic printing plate in any suitable manner. The gumming solution can be a processing solution comprising one or more compounds represented by Structure (I), or it can be solution that is known in the art for that purpose containing one or more gumming compounds, which solution contains no compounds represented by Structure (I). Useful known gumming solutions of this type are described for example, in U.S. Pat. No. 9,195,141 (Hotate et al.), the disclosure of which is incorporated herein by reference.

It is also optional to further bake the lithographic printing plate with or without blanket or floodwise exposure to UV or visible radiation. Alternatively, a blanket UV or visible radiation exposure can be carried out, without a postbake operation. Postbaking the exposed and processed lithographic printing plate can be carried out at a temperature of at least 180° C. and up to and including 300° C. for at least 10 seconds and up to and including 10 minutes.

After the described processing and optional drying, the resulting lithographic printing plate can be mounted onto a printing press for printing.

In some embodiments, a method according to the present invention comprises the following steps, in order, some of which steps are optional:

($A_1$) heating the imagewise exposed precursor before step (B);

($A_2$) if a non-radiation-sensitive hydrophilic layer is present in the lithographic printing plate precursor, washing the imagewise exposed precursor before step (B) to remove the non-radiation-sensitive hydrophilic layer;

(B) after using the preheating step ($A_1$) and using the washing step ($A_2$), treating the imagewise exposed precursor with the processing solution according to the present invention to remove either the exposed regions or the non-exposed regions in the one or more radiation-sensitive imageable layers, to provide a lithographic printing plate;

($C_1$) rinsing the lithographic printing plate with water after step (B);

($C_2$) applying a gumming solution to the lithographic printing plate after step (B), wherein the gumming solution can be different from the processing solution used in step (B), or it can be the same processing solution used in step (B) but adjusted to a different concentration of the one or more compounds represented by Structure (I);

($C_3$) drying, curing, or both drying and curing, the lithographic printing plate after step (B) using either or both of blown hot air at a temperature of at least 40° C. and up to and including 150° C., or irradiation with a light source, or both the blown air and the irradiation; and (D) mounting the lithographic printing plate onto a printing press. In other embodiments, the present invention further comprises, in order:

($A_1$) optionally heating the imagewise exposed precursor;

(B) treating the imagewise exposed precursor with the processing solution to remove either the exposed regions or the non-exposed regions in the one or more radiation-sensitive imageable layers, to provide the lithographic printing plate;

($C_2$) applying a gumming solution to the lithographic printing plate after step (B), which gumming solution can be a processing solution comprising one or more compounds represented by Structure (I), or the gumming solution can be a solution containing no compounds represented by Structure (I); and (D) mounting the lithographic printing plate onto a printing press.

Printing:

Printing can be carried out by putting the exposed and processed lithographic printing plate on a suitable printing press. The lithographic printing plate is generally secured in the printing press using suitable clamps or other holding devices. Once the lithographic printing plate is secured in the printing press, printing is carried out by applying a lithographic printing ink and fountain solution to the printing surface of the lithographic printing plate in a suitable manner. The fountain solution is taken up by the hydrophilic surface of the substrate revealed by the exposing and processing steps, and the lithographic ink is taken up by the remaining regions of the imageable layer(s). The lithographic ink is then transferred to a suitable receiving material (such as cloth, paper, metal, glass, or plastic) to provide a desired impression of the image thereon. If desired, an intermediate "blanket" roller can be used to transfer the lithographic ink from the lithographic printing plate to a receiving material (for example, sheets of paper). The lithographic printing plates can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A processing solution for developing imagewise exposed lithographic printing plate precursors, the processing solution having a pH of at least 2 and a % non-volatiles of at least 1% and up to and including 15%, the processing solution comprising:

one or more compounds represented by the following Structure (I), in an amount of at least 0.1 weight % and up to and including 10 weight %, based on the total weight of the processing solution, $$R^1-C(=O)-N(R^2)-R^3 \qquad (I)$$

wherein R¹, R², and R³ independently represent hydrogen or a substituted or unsubstituted hydrocarbon group, or two or three of R¹, R², and R³ are combined to form one or more cyclic rings, and the total number of carbon atoms in the Structure (I) molecule is at least 7 and up to and including 33.

2. A processing solution concentrate suitable for developing imagewise exposed lithographic printing plate precursors upon dilution with water, the processing solution concentrate having a pH of at least 2 and a % non-volatiles of at least 3% and up to and including 45%, the processing solution concentrate comprising:

one or more compounds represented by the following Structure (I), in an amount of at least 0.2 weight % and up to and including 30 weight %, based on the total weight of the processing solution concentrate:

R¹—C(=O)—N(R²)—R³ (I)

wherein R¹, R², and R³ independently represent hydrogen or a substituted or unsubstituted hydrocarbon group, or two or three of R¹, R², and R³ are combined to form one or more cyclic rings, and the total number of carbon atoms in the Structure (I) molecule is at least 7 and up to and including 33.

3. Embodiment 1 or 2, wherein the total number of carbon atoms in the molecule represented by Structure (I) is at least 7 and up to and including 22.

4. Embodiment 1 or 3, wherein the one or more compounds represented by Structure (I) are present in the processing solution in an amount of at least 0.2 weight % and up to and including 5 weight %, based on the total weight of the processing solution.

5. Any of embodiments 1 to 4, wherein the total number of carbon atoms in the molecule is at least 8 and up to and including 22.

6. Any of embodiments 1 to 5, having a pH of at least 2 and up to and including 13.7.

7. Any of embodiments 1 to 5, having a pH of at least 6 and up to and including 11.

8. Any of embodiments 1 and 3 to 7, further comprising one or more of the following additional components (1) through (4), all of which are different from the one or more compounds represented by Structure (I):

component (1) that is a pH buffer composition and can be present in the processing solution in an amount of at least 0.1 weight % and up to and including 10 weight %, based on the total weight of the processing solution;

component (2) that is a surfactant composition, and can be present in the processing solution in an amount of at least 0.1 weight % and up to and including 10 weight %, based on the total weight of the processing solution;

component (3) that is a solution promoter, and can be present in the processing solution in an amount of at least 0.1 weight % and up to and including 5 weight %, based on the total weight of the processing solution; and component (4) that is a hydrophilic surface protective composition, and can be present in the processing solution in an amount of at least 0.1 weight % and up to and including 10 weight %, based on the total weight of the processing solution.

9. Any of embodiments 1 to 8, wherein the one or more compounds represented by Structure (I) are selected from the group consisting of:

N-octylpyrrolidone, N-cyclohexylpyrrolidone, N-phenylpyrrolidone, N-benzyl-2-pyrrolidinone, 1-(3-hydroxypropyl)-2-pyrrolidone, N-decylpyrrolidone, N-laurylpyrrolidone, N,N-dimethyloctylamide, N,N-dimethyldecylamide, N,N-dimethyldeceneamide, N,N-dimethylundeceneamide, 5-dimethylamino-2-methyl-5-oxopentanoic acid methyl ester, N,N-diethyldodecylamide, N,N-diethyldecylamide, N,N-diethylhexadecylamide, N,N-dimethylhexadecylamide, N,N-dimethylheptylamide, N,N-dimethyloctadecylamide, N,N-dimethyl-5,8,11,14-eicosatetraenamide, N,N-dimethyl-(2E,4E)-2,4-hexadienamide, N,N-diethyl-5-methyl-3-octenamide, N-methyl-N-octylacetamide, N,N-diethylundecylamide, N,N-bis(1-methylethyl)-octylamide, N,N-bis(1-methylethyl)-nonylamide, N,N-2-triethylhexylamide, and N,N-diethyl-(9Z)-9-octadecenamide, lauramide DEA.

10. Any of embodiments 2 and 3 to 9, further comprising one or more of the following additional components (1) through (4), all of which are different from the one or more compounds represented by Structure (I):

component (1) that is a pH buffer composition and can be present in the processing solution concentrate in an amount of at least 0.2 weight % and up to and including 15 weight %, based on the total weight of the processing solution concentrate;

component (2) that is a surfactant composition, and can be present in the processing solution concentrate in an amount of at least 0.2 weight % and up to and including 15 weight %, based on the total weight of the processing solution concentrate;

component (3) that is a solution promoter, and can be present in the processing solution concentrate an amount of at least 0.2 weight % and up to and including 10 weight %, based on the total weight of the processing solution concentrate; and component (4) that is a hydrophilic surface protective composition, and can be present in the processing solution concentrate in an amount of at least 0.2 weight % and up to and including 15 weight %, based on the total weight of the processing solution concentrate.

11. Any of embodiments 1 and 3-9, wherein the processing solution has % non-volatiles of at least 1% and up to and including 15 weight %.

12. A method for preparing a lithographic printing plate, the method comprising the steps of, in order:

(A) imagewise exposing a lithographic printing plate precursor comprising a substrate having a hydrophilic surface, and having disposed on the hydrophilic surface of the substrate:

one or more radiation-sensitive imageable layers including an outermost radiation-sensitive imageable layer, and optionally, a non-radiation-sensitive hydrophilic overcoat disposed on the outermost radiation-sensitive imageable layer, to provide an imagewise exposed precursor comprising exposed regions and non-exposed regions in the one or more radiation-sensitive imageable layers;

(B) treating the imagewise exposed precursor with one or more successive applications of a processing solution of any of embodiments 1, 3 to 9, and 11, to remove either the exposed regions or the non-exposed regions in the one or more radiation-sensitive imageable layers, to provide a lithographic printing plate.

13. The method of embodiment 12, optionally further comprising one or more of the following steps, in order:

(A₁) heating the imagewise exposed precursor before step (B);

(A₂) if the non-radiation-sensitive hydrophilic layer is present in the lithographic printing plate precursor, washing the imagewise exposed precursor before step (B) to remove the non-radiation-sensitive hydrophilic layer;

(B) after using the preheating step ($A_1$) and using the washing step ($A_2$), the treating the imagewise exposed precursor with the processing solution to remove either the exposed regions or the non-exposed regions in the one or more radiation-sensitive imageable layers, to provide the lithographic printing plate, ($C_1$) rinsing the lithographic printing plate with water after step (B);

($C_2$) applying a gumming solution to the lithographic printing plate after step (B), wherein the gumming solution can be different from the processing solutions used in step (B), or it can be the same processing solution used in step (B) but adjusted to a different concentration of the one or more compounds represented by Structure (I);

($C_3$) drying, curing, or both drying and curing, the lithographic printing plate after step (B) using either blown hot air at a temperature of at least 40° C. and up to and including 150° C., irradiation with a light source, or both the blown hot air and the irradiation; and (D) mounting the lithographic printing plate onto a printing press.

14. The method of embodiment 12 or 13, comprising treating the imagewise exposed precursor with at least two successive applications of the same or different processing solution, each of the same or different processing solutions comprising one or more compounds represented by Structure (I).

15. The method of embodiment 14, wherein excess processing solution is mechanically removed from the lithographic printing plate between the at least two successive applications of the same or different processing solution.

16. The method of any of embodiments 12, 14, or 15, wherein each of the one or more successive applications of the processing solutions is carried out in a dip tank or with a spray bar processor, each at a temperature of at least 20° C. and up to and including 40° C., and optionally while using at least one rotating brush.

17. The method of any of embodiments 12 and 14 to 16, further comprising, in order:

($A_1$) optionally heating the imagewise exposed precursor;

(B) treating the imagewise exposed precursor with the processing solution to remove either the exposed regions or the non-exposed regions in the one or more radiation-sensitive imageable layers, to provide the lithographic printing plate;

($C_2$) applying a gumming solution to the lithographic printing plate after step (B), which gumming solution can be a processing solution comprising one or more compounds represented by Structure (I), or the gumming solution can be a solution containing no compounds represented by Structure (I); and (D) mounting the lithographic printing plate onto a printing press.

18. The method of any of embodiments 12 to 17, wherein the lithographic printing plate precursor is a negative-working lithographic printing plate precursor comprising a negative-working radiation-sensitive imageable layer that is sensitized to: near-infrared or infrared radiation having a wavelength of at least 750 nm; or to UV or visible radiation having a wavelength of at least 250 nm and up to and including 550 nm.

19. The method of embodiment 18, wherein the lithographic printing plate precursor is a negative-working lithographic printing plate precursor comprising a negative-working radiation-sensitive imageable layer that is sensitized to UV or visible radiation having a wavelength of at least 250 nm and up to and including 550 nm.

20. The method of embodiment 18 or 19, wherein the negative-working lithographic printing plate precursor further comprises the non-radiation-sensitive hydrophilic layer disposed on the negative-working radiation-sensitive imageable layer.

21. The method of any of embodiments 18 to 20, wherein the negative-working radiation-sensitive imageable layer comprises one or more free radical polymerizable components, an initiator composition comprising one or more free radical initiators, and one or more radiation absorbing compounds.

22. The method of embodiment 21, wherein the one or more free radical polymerizable components are one or more urethane (meth)acrylate compounds.

23. A method for preparing a lithographic printing plate, the method comprising the steps of, in order:

(A) imagewise exposing a lithographic printing plate precursor comprising a substrate having a hydrophilic surface, and having disposed on the hydrophilic surface of the substrate:

one or more radiation-sensitive imageable layers including an outermost radiation-sensitive imageable layer, and optionally, a non-radiation-sensitive hydrophilic overcoat disposed on the outermost radiation-sensitive imageable layer, to provide an imagewise exposed precursor comprising exposed regions and non-exposed regions in the one or more radiation-sensitive imageable layers;

(B) treating the imagewise exposed precursor with one or more successive applications of a processing solution to remove either the exposed regions or the non-exposed regions in the one or more radiation-sensitive imageable layers, to provide a lithographic printing plate, wherein the processing solution is prepared in situ by diluting the processing solution concentrate of any of embodiments 2 and 3 to 9 with water.

The following Examples are provided to illustrate the practice of this invention and are not meant to be limiting in any manner. The following components in TABLE I were used in the Examples.

TABLE I

| | |
|---|---|
| Monomer 1 | Molar reaction product of trimethyl hexamethylenediisocyanate and hydroxyethyl methacrylate |
| Monomer 2 | Reaction product derived from 1 mol of hexamethylenediisocyanate, 1 mol of hydroxyethyl methacrylate, and 0.5 mol of hydroxyethylpiperidine |
| Acticide ® LA 1206 | Biocide (Thor Specialties, Inc.) |
| Sensitizer 1 | 1,2-Bis-{2[4-(2-ethylhexyloxy)-3,5-dimethoxyphenyl]-vinyl} benzene-synthesized according to the procedure described in WO2005029187. |

TABLE I-continued

| | |
|---|---|
| Binder 1 | S-Lec BX35Za poly(vinyl acetal) bearing 14 mol % of free alcohol groups (Sekisui, Japan) |
| Tego ® Glide 410 | Polyether siloxane copolymer surfactant (Evonik Industries) |
| HABI | 2,2'-Bis(o-chlorophenyl)-4,4',5,5'-tetraphenyl-1,1'-biimidazole (Sumitomo, Japan) |
| Pigment | 50 weight % Hostaperm ® Blue P-BFSTM (Clariant AG) dispersed in 50 weight % of Disperbyk ® 182 (BYK Chemie) |
| MBT | 2-Mercaptobenzthiazole (available from Aldrich) |
| Emulsogen ® TS160 | 2,4,6-Tri(1-phenylethyl)-phenol polyglycol ether with 16 ethylene oxide units (Clariant AG) |
| Albritect ® CP30 | Copolymer derived from acrylic acid and vinyl phosphoric acid (Rhodia) |
| Advantage ™ S | Copolymer derived from vinyl pyrrolidone, vinyl caprolactam, and dimethylaminoethyl methacrylate (Ashland Performance Materials) |
| Dextrin | Yellow (Roth Chemical Company) |
| Dowanol ® PM | Propylene glycol monomethylether solvent (Dow Chemical) |
| Klucel ™ E | Hydroxypropyl cellulose (Ashland Performance Materials) |
| MEK | Methyl ethyl ketone (available from various chemical sources) |
| Sodium gluconate | Available from Ashland Performance Materials |
| Glycine | Available from Roth Chemical Company |
| Triethanolamine | Available from Sigma-Aldrich Corporation |
| Lutensol ® A8 | Ammonium polyaspartate dispersant (BASF) |
| Sipomer ® PAM-100 | Phosphate functionalized methacrylate with polyalkylene oxide spacer (Rhodia) |
| TRIS | 2-Amino-2-hydroxymethyl-propane-1,3-diol (Sigma-Aldrich Corporation) |
| PVA1 | Poval ® 4-88, partially hydrolyzed poly(vinyl alcohol) (Kuraray, Japan) |
| PVA2 | Poval ® 4-98, fully hydrolyzed poly(vinyl alcohol) (Kuraray, Japan) |
| Texapon ® 842 | Fatty alcohol sulfate surfactant (Cognis) |
| Comparative solvent 1 | Ethylan ® HB4 (alkoxylated phenol, Akzo Nobel) |
| Comparative solvent 2 | Phenoxyethanol (Merck) |
| Comparative solvent 3 | Ethylene glycol monobutyl ether (Merck) |
| Comparative solvent 4 | Tripropylene glycol monobutyl ether (Dow Chemical) |
| Comparative solvent 5 | N,N-dimethylbutyramide (synthesized according to the procedure described in EP 2,632,256A2, Stepan Company) |
| Invention solvent 1 | N-Octyl pyrrolidone (synthesized according to the procedure described in U.S. Pat. No. 5,294,644. Login et al., the disclosure of which is incorporated herein by reference) |
| Invention solvent 2 | N-Cyclohexyl pyrrolidone (synthesized according to the procedure described in U.S. Pat. No. 5,294,644, noted above) |
| Invention solvent 3 | N-Phenyl pyrrolidone (synthesized according to the procedure described in U.S. Pat. No. 5,294,644, noted above) |
| Invention solvent 4 | N-Decyl pyrrolidone (synthesized according to the procedure described in U.S. Pat. No. 5,294,644, noted above) |
| Invention solvent 5 | N-Lauryl pyrrolidone (synthesized according to the procedure described in U.S. Pat. No. 5,294,644, noted above) |
| Invention solvent 6 | N,N-Dimethyloctylamide (synthesized according to the procedure described in EP 2,632,256A2, noted above) |
| Invention solvent 7 | N,N-Dimethyldecylamide (synthesized according to the procedure described in EP 2,632,256A2, noted above) |
| Invention solvent 8 | N,N-Dimethyldeceneamide (synthesized according to the procedure described in EP 2,632,256A2, noted above) |
| Invention solvent 9 | N,N-Dimethylundeceneamide (synthesized according to the procedure described in EP 2,632,256A2, noted above) |
| Invention solvent 10 | 5-Dimethylamino-2-methyl-5-oxopenanoic acid methyl ester (commercially available from Rhodia.) |

Preparation of Lithographic Printing Plate Precursor P1 Having Sensitivity to 405 nm Imaging Radiation:

An electrochemically roughened and anodized aluminum foil with an aluminum oxide weight of 2.5 g/m$^2$ was subjected to a post-treatment using an aqueous solution of poly(vinyl phosphoric acid) to provide a hydrophilic surface on the resulting substrate. The average roughness of the resulting hydrophilic surface of this substrate was 0.40 μm. A, negative-working radiation-sensitive imageable layer coating composition having the components shown in TABLE II below was disposed onto the hydrophilic surface of the substrate after filtering using a wire bar coater. The resulting coating was dried for 4 minutes at 90° C. to provide a dry negative-working radiation-sensitive imageable layer having a coating weight of 1.2 g/m$^2$.

A hydrophilic overcoat composition having the components shown in TABLE III below was applied to the negative-working radiation-sensitive imageable layer, and dried for 4 minutes at 90° C. to provide a dry coating weight of 2.2 g/m$^2$ on the resulting lithographic printing plate precursor P1.

TABLE II

| Imageable Layer Composition Coated as 14 weight % Solution in Dowanol ® PM/MEK (4/1 by volume) | |
|---|---|
| | Solids Content (%) |
| Monomer 1 | 13.0 |
| Monomer 2 | 38.0 |

TABLE II-continued

Imageable Layer Composition Coated as 14 weight %
Solution in Dowanol® PM/MEK (4/1 by volume)

| | Solids Content (%) |
|---|---|
| Sensitizer 1 | 4.4 |
| Binder 1 | 20.0 |
| Tego® Glide 410 | 0.2 |
| HABI | 6.5 |
| Pigment | 5.0 |
| MBT | 0.9 |
| Albritect® CP30 | 2.0 |
| Sipomer® PAM 100 | 10.0 |

TABLE III

Hydrophilic Overcoat Composition Coated as
6 weight % solution in water

| | Solids Content (%) |
|---|---|
| PVA1 | 60.0 |
| PVA2 | 37.0 |
| Acticide® LA 1206 | 0.2 |
| Advantage™ S | 2.0 |
| Lutensol® A8 | 0.8 |

Exposure and Processing of Lithographic Printing Plate Precursor P1 for Invention Examples I-1 to I-17 and Comparative Examples C-1 to C-7:

Lithographic printing plate precursor P1 described above was imagewise exposed using a commercially available computer-to-plate platesetter (Heidelberg Prosetter, exposure energy of 50 µJ/cm$^2$) that was equipped with a 405 nm laser diode. Samples of the imagewise exposed precursor were individually developed using a processing solution having the components and Ph shown in TABLES IV-A, IV-B, and IV-C below.

Evaluation of Processing Solutions:

Test 1: Simulation of Dispersing Properties of Processing Solution

The ability for each of the processing solutions shown below in TABLES IV-A, IV-B, and IV-C to dissolve or disperse polymerizable compounds used in precursor P1 was assessed by stirring a mixture of Monomer 1 (0.5 g) and Monomer 2 (1.5 g) in 100 ml of each processing solution in a capped polypropylene bottle for 3 hours at room temperature, and then letting the components in the resulting mixture settle overnight. Each mixture was then evaluated and given one of the following qualitative ratings:
 1—clear solution or dispersion, no precipitate;
 2—some precipitate, but easily redispersible after rinsing with water;
 3—some precipitate, but redispersible with developer, and not with water;
 4—some sticky precipitate, not redispersible;
 5—huge amount of precipitate or no redispersion of monomers at all.

Test 2: —Evaluation of Screen Developing Properties of Processing Solution

Another lithographic printing plate precursor P1 was cut into precursor strips (samples) of dimensions of 5×20 cm$^2$. Some of the precursor strips were artificially aged by storage at 88° C. for one hour ("aged precursor strips"). Other precursor strips were evaluated without aging ("fresh precursor strips"). Each of the precursor strips (both "aged" and "fresh") was imagewise exposed to a screen of 50% 150 lpi screen rulings at operating exposure settings (50 µJ/cm$^2$) and preheated for 20 seconds at 110° C. to form an exposed precursor strip. The preheated and exposed precursor strip was then dipped into a cuvette loaded with 200 ml of the respective processing solution for 5 seconds, and half of the precursor strip was rubbed with a wet cloth and then dried. According to tonal value differences between the wiped and unwiped parts as determined by measurement of dot coverage with a Techkon Optical Microscope, each precursor strip was given a qualitative rating as follows:
 1—developed very easily with no shadow plugging, and no tonal value differences between rubbed and non-rubbed;
 2—developed easily with no shadow plugging, and minor tonal value differences of 5-10%;
 3—developed well with no shadow plugging, and tonal value differences ≤20%;
 4—developed with no shadow plugging, but tonal value differences >20%;
 5—developed hardly with shadow plugging.

Test 3: Evaluation of Background Developing Properties with Processing Solution

Another lithographic printing plate precursor P1 was cut into precursor strips (samples) having dimensions of 5×20 cm$^2$. Some of the precursor strips were artificially aged at 88° C. for one hour ("aged precursor strips"). Other precursor strips were evaluated without aging ("fresh precursor strips"). Each precursor strip (both "aged" and "fresh") was preheated for 20 seconds at 110° C., cooled to room temperature, dipped into a cuvette loaded with 200 ml of the respective processing solution for 5 seconds, and then half of the precursor strip was rubbed with an inked cloth. The amount of residual imageable layer left on the substrate after rubbing each sample of the precursor P1 was assessed by a commercially available optical densitometer such as the Scan-Densitomer RS 400 from Techkon using known procedures. Based on the results of such measurements, the ability of each of the processing solutions to process lithographic printing plate precursor P1 was given one of the following qualitative ratings:
 1—developed very easily with no staining observed in the part wiped with the inked cloth, and the remaining optical density (OD) in the unwiped part after 5 seconds development was about 0;
 2—developed easily with no staining observed in the part wiped with the inked cloth, and the remaining OD in the unwiped part was <5%;
 3—developed well with no staining observed in the part wiped with the inked cloth, and the remaining OD in the unwiped part was <10%;
 4—developed with no staining observed in the part wiped with the inked cloth, and the remaining OD in the unwiped part was <20%;
 5—developed very little and staining was observed in the part wiped with the inked cloth, while the remaining OD in the unwiped part was >20%.

The results of these Tests 1-3 are shown in the following TABLES V-A, V-B, and V-C.

TABLE IV-A (weight % based on total processing solution weight)

| Processing Solution Component | I-1 | I-2 | I-3 | I-4 | I-5 | I-6 | I-7 | I-8 | I-9 | I-10 |
|---|---|---|---|---|---|---|---|---|---|---|
| Dextrin | 0.50 | 0.50 | 0.50 | 0.50 | 0.50 | 0.50 | 0.50 | 0.50 | 0.50 | 0.50 |
| Klucel ™ E | 0 | 0 | 0 | 0 | 0 | 0 | 0 | 0 | 0 | 0 |
| Sodium gluconate | 0 | 0 | 0 | 0 | 0 | 0 | 0 | 0 | 0 | 0 |
| Emulsogen ® TS160 | 2.0 | 2.0 | 2.0 | 2.0 | 2.0 | 2.0 | 2.0 | 2.0 | 2.0 | 2.0 |
| Texapon ® 842 | 1.0 | 1.0 | 1.0 | 1.0 | 1.0 | 1.0 | 1.0 | 1.0 | 1.0 | 1.0 |
| TRIS | 1.0 | 1.0 | 1.0 | 1.0 | 1.0 | 1.0 | 1.0 | 1.0 | 1.0 | 1.0 |
| Glycine | 0 | 0 | 0 | 0 | 0 | 0 | 0 | 0 | 0 | 0 |
| Triethanolamine | 0 | 0 | 0 | 0 | 0 | 0 | 0 | 0 | 0 | 0 |
| Invention solvent 1 | 0.90 | 0.30 | 0.30 | 0 | 0 | 0 | 0 | 0 | 0 | 0 |
| Invention solvent 2 | 0 | 0 | 0 | 0.90 | 0 | 0 | 0 | 0 | 0 | 0 |
| Invention solvent 3 | 0 | 0 | 0 | 0 | 0.90 | 0 | 0 | 0 | 0 | 0 |
| Invention solvent 4 | 0 | 0 | 0 | 0 | 0 | 0.90 | 0 | 0 | 0 | 0 |
| Invention solvent 5 | 0 | 0 | 0.60 | 0 | 0 | 0 | 0.90 | 0 | 0 | 0 |
| Invention solvent 6 | 0 | 0 | 0 | 0 | 0 | 0 | 0 | 0.90 | 0 | 0 |
| Invention solvent 7 | 0 | 0 | 0 | 0 | 0 | 0 | 0 | 0 | 0.90 | 0 |
| Invention solvent 8 | 0 | 0 | 0 | 0 | 0 | 0 | 0 | 0 | 0 | 0.90 |
| Invention solvent 9 | 0 | 0 | 0 | 0 | 0 | 0 | 0 | 0 | 0 | 0 |
| Invention solvent 10 | 0 | 0.60 | 0 | 0 | 0 | 0 | 0 | 0 | 0 | 0 |
| Comparative solvent 1 | 0 | 0 | 0 | 0 | 0 | 0 | 0 | 0 | 0 | 0 |
| Comparative solvent 2 | 0 | 0 | 0 | 0 | 0 | 0 | 0 | 0 | 0 | 0 |
| Comparative solvent 3 | 0 | 0 | 0 | 0 | 0 | 0 | 0 | 0 | 0 | 0 |
| Comparative solvent 4 | 0 | 0 | 0 | 0 | 0 | 0 | 0 | 0 | 0 | 0 |
| Comparative solvent 5 | 0 | 0 | 0 | 0 | 0 | 0 | 0 | 0 | 0 | 0 |
| Water | 94.4 | 94.4 | 94.4 | 94.4 | 94.4 | 94.4 | 94.4 | 94.4 | 94.4 | 94.4 |
| Ph | 8.0 | 8.0 | 8.0 | 8.0 | 8.0 | 8.0 | 8.0 | 8.0 | 8.0 | 8.0 |

TABLE IV-B (weight % based on total processing solution weight)

| Processing Solution Component | I-11 | I-12 | I-13 | I-14 | I-15 | I-16 | I-17 | C-1 | C-2 | C-3 |
|---|---|---|---|---|---|---|---|---|---|---|
| Dextrin | 0.50 | 0.50 | 0.50 | 0.50 | 0.50 | 0.50 | 0 | 0 | 0.50 | 0.50 |
| Klucel ™ E | 0 | 0 | 0 | 0 | 0 | 0 | 0.50 | 0 | 0 | 0 |
| Sodium gluconate | 0 | 0 | 0 | 0 | 0 | 0 | 0 | 3.00 | 0 | 0 |
| Emulsogen ® TS160 | 2.00 | 2.00 | 2.00 | 2.00 | 2.00 | 2.00 | 2.00 | 1.50 | 2.00 | 2.00 |
| Texapon ® 842 | 1.00 | 1.00 | 1.00 | 1.00 | 1.00 | 1.00 | 1.00 | 0 | 1.00 | 1.00 |
| TRIS | 1.00 | 1.00 | 1.00 | 1.00 | 0 | 0 | 0 | 4.90 | 0 | 0 |
| Glycine | 0 | 0 | 0 | 0 | 1.00 | 0 | 0 | 0 | 0 | 0 |
| Triethanolamine | 0 | 0 | 0 | 0 | 0 | 1.00 | 1.00 | 0 | 1.00 | 1.00 |
| Invention solvent 1 | 0 | 0 | 0 | 0 | 0 | 0 | 0 | 0 | 0 | 0 |
| Invention solvent 2 | 0 | 0 | 0 | 0 | 0 | 0 | 0 | 0 | 0 | 0 |
| Invention solvent 3 | 0 | 0 | 0 | 0 | 0 | 0 | 0 | 0 | 0 | 0 |
| Invention solvent 4 | 0 | 0 | 0 | 0 | 0 | 0 | 0 | 0 | 0 | 0 |
| Invention solvent 5 | 0 | 0 | 0 | 0 | 0 | 0 | 0 | 0 | 0 | 0 |
| Invention solvent 6 | 0 | 0 | 0 | 0 | 0 | 0 | 0 | 0 | 0 | 0 |
| Invention solvent 7 | 0 | 0 | 0 | 0 | 0 | 0 | 0 | 0 | 0 | 0 |
| Invention solvent 8 | 0 | 0 | 0 | 0 | 0 | 0 | 0 | 0 | 0 | 0 |
| Invention solvent 9 | 0.90 | 1.80 | 0 | 0 | 0 | 0 | 0 | 0 | 0 | 0 |
| Invention solvent 10 | 0 | 0 | 0.90 | 0.90 | 0.90 | 0.90 | 0.90 | 0 | 0 | 0 |
| Comparative solvent 1 | 0 | 0 | 0 | 0.90 | 0 | 0 | 0 | 5.00 | 0.90 | 0 |
| Comparative solvent 2 | 0 | 0 | 0 | 0 | 0 | 0 | 0 | 0 | 0.90 | 0 |
| Comparative solvent 3 | 0 | 0 | 0 | 0 | 0 | 0 | 0 | 0 | 0 | 0.90 |
| Comparative solvent 4 | 0 | 0 | 0 | 0 | 0 | 0 | 0 | 0 | 0 | 0 |
| Comparative solvent 5 | 0 | 0 | 0 | 0 | 0 | 0 | 0 | 0 | 0 | 0 |
| Water | 94.4 | 93.5 | 94.4 | 93.5 | 94.4 | 94.4 | 94.4 | 85.5 | 94.4 | 94.4 |
| pH | 8.0 | 8.0 | 8.0 | 8.0 | 10.0 | 8.0 | 8.0 | 10.0 | 8.0 | 8.0 |

TABLE IV-C (weight % based on total processing solution weight)

| Processing Solution Component | C-4 | C-5 | C-6 | C-7 |
|---|---|---|---|---|
| Dextrin | 0.50 | 0.50 | 0.50 | 0.50 |
| Klucel ™ E | 0 | 0 | 0 | 0 |
| Sodium gluconate | 0 | 0 | 0 | 0 |
| Emulsogen ® TS160 | 2.00 | 2.00 | 2.00 | 2.00 |

TABLE IV-C-continued (weight % based on total processing solution weight)

| Processing Solution Component | C-4 | C-5 | C-6 | C-7 |
|---|---|---|---|---|
| Texapon ® 842 | 1.00 | 1.00 | 1.00 | 1.00 |
| TRIS | 0 | 0 | 0 | 0 |
| Glycine | 0 | 0 | 0 | 0 |
| Triethanolamine | 1.00 | 1.00 | 1.00 | 1.00 |
| Invention solvent 1 | 0 | 0 | 0 | 0 |
| Invention solvent 2 | 0 | 0 | 0 | 0 |
| Invention solvent 3 | 0 | 0 | 0 | 0 |
| Invention solvent 4 | 0 | 0 | 0 | 0 |
| Invention solvent 5 | 0 | 0 | 0 | 0 |
| Invention solvent 6 | 0 | 0 | 0 | 0 |
| Invention solvent 7 | 0 | 0 | 0 | 0 |
| Invention solvent 8 | 0 | 0 | 0 | 0 |
| Invention solvent 9 | 0 | 0 | 0 | 0 |
| Invention solvent 10 | 0 | 0 | 0 | 0 |
| Comparative solvent 1 | 0 | 0 | 0 | 0 |
| Comparative solvent 2 | 0 | 0 | 0 | 0 |
| Comparative solvent 3 | 0.90 | 0 | 0 | 0 |
| Comparative solvent 4 | 0 | 0.90 | 0 | 1.80 |
| Comparative solvent 5 | 0 | 0 | 0.90 | 0 |
| Water | 94.4 | 94.4 | 94.4 | 93.5 |
| pH | 8.0 | 8.0 | 8.0 | 8.0 |

TABLE V-A

| Test | I-1 | I-2 | I-3 | I-4 | I-5 | I-6 | I-7 | I-8 |
|---|---|---|---|---|---|---|---|---|
| 1 | 2 | 2 | 2 | 2 | 2 | 2 | 2 | 2 |
| 2 (fresh precursor strips) | 2 | 2 | 2 | 2 | 2 | 2 | 2 | 2 |
| 2 (aged precursor strip) | 2 | 2 | 2 | 2 | 2 | 2 | 2 | 2 |
| 3 (fresh precursor strip) | 1 | 1 | 1 | 1 | 1 | 1 | 1 | 1 |
| 4 (aged precursor strip) | 2 | 2 | 2 | 2 | 2 | 2 | 2 | 2 |

TABLE V-B

| Test | I-9 | I-10 | I-11 | I-12 | I-13 | I-14 | I-15 | I-16 |
|---|---|---|---|---|---|---|---|---|
| 1 | 2 | 2 | 2 | 1 | 2 | 2 | 2 | 2 |
| 2 (fresh precursor strip) | 2 | 2 | 2 | 1 | 2 | 2 | 2 | 2 |
| 2 (aged precursor strip) | 2 | 2 | 2 | 2 | 2 | 2 | 2 | 2 |
| 3 (fresh precursor strip) | 1 | 1 | 1 | 1 | 1 | 1 | 1 | 1 |
| 3 (aged precursor strip) | 2 | 2 | 2 | 1 | 2 | 1 | 1 | 2 |

TABLE V-C

| Test | I-17 | C-1 | C-2 | C-3 | C-4 | C-5 | C-6 | C-7 |
|---|---|---|---|---|---|---|---|---|
| 1 | 2 | 3 | 5 | 4 | 5 | 4 | 2 | 3 |
| 2 (fresh precursor strip) | 2 | 2 | 3 | 2 | 3 | 3 | 2 | 2 |
| 2 (aged precursor strip) | 2 | 2 | 4 | 3 | 4 | 4 | 3 | 2 |
| 3 (fresh precursor strip) | 2 | 2 | 2 | 2 | 2 | 2 | 1 | 1 |
| 3 (aged precursor strip) | 2 | 2 | 3 | 3 | 3 | 3 | 2 | 2 |

As it can be seen from the results in TABLES V-A, V-B, and V-C, inventive processing solutions I-1 through I-17 according to the present invention demonstrated an ability to dissolve or disperse polymerizable compounds such as Monomer 1 and Monomer 2 used in the imageable layer of precursor P1 without any formed precipitates that are hard to rinse with water (ratings 1 and 2 in Test 1), and demonstrated strong developing power for imagewise exposed lithographic printing plate precursors such as P1 without the need for strong mechanical assistance such as methanical wiping (tonal value differences in 50% 150 lpi screen ruling between wiped and unwiped regions <10%), and without leaving behind significant residual imageable layer that would accept lithographic printing ink in the non-printing regions (remaining OD in Test 3<5). The ability to disperse polymerizable compounds is a key requirement in order for an inventive processing solution to achieve long processing cycles, keep the processing equipment clean, and minimize efforts needed to clean such processing equipment before a new processing cycle can be restarted with fresh processing solution (or addition of processing solution concentrate, with dilution).

In particular, from the good results observed from use of processing solutions I-2 and I-3 one can see that a mixture of two compounds represented by Structure (I) can be used to advantage. The good results from processing solution I-14 illustrates the possibility of using a solvent outside the scope of Structure (I) as long as a compound represented by Structure (I) is also present. From the similar results from use of processing solutions I-13 and I-16, it can be seen that different pH buffers can be used as long as a compound represented by Structure (I) is present, which is further supported by the good results from use of processing solution I-15 where yet a different pH buffer (component (1)) was used. The similarity between processing solutions I-17 and 1-16 shows that it is possible to use different hydrophilic surface protective composition (component (4)) in processing solutions containing one or more compounds represented by Structure (I) as an essential component.

On the other hand, comparative processing solutions C1-C7 delivered inferior performance in at least one of the Tests 1 to 3 due to the absence of compounds represented by Structure (I), even though other solvents were present. In particular, one can see from the use of comparative processing solution C-6 that amide solvents outside the scope of Structure (I) with less than 7 total carbon atoms (N,N-dimethylbutyramide) are not able to provide a processing solution having the adequate power to clean out the screen rulings of an aged imagewise exposed lithographic printing plate precursor such as precursor P1, even though it demonstrated comparable capability of dispersing polymerizable compounds such as Monomer 1 and Monomer 2 used in precursor P1. Furthermore, amide solvents outside the scope of Structure (I) with less than 7 total carbon atoms are relatively volatile and can detrimentally affect the health of operators and the environment. For example, the boiling point of N,N-dimethylbutyramide (Comparative solvent 5) is only 186.0° C. In the absence of any amide Structure (I) compound, the ability for the processing solution to disperse polymerizable compounds was inadequate as it can be seen from the inferior results in Test 1 for comparative processing solutions C-2, C-3, C-4, C-5 and C-7.

The invention has been described in detail with particular reference to certain preferred embodiments thereof, but it will be understood that variations and modifications can be effected within the spirit and scope of the invention.

The invention claimed is:

1. A method for preparing a lithographic printing plate, the method comprising the steps of, in order:

(A) imagewise exposing a lithographic printing plate precursor comprising a substrate having a hydrophilic surface, and having disposed on the hydrophilic surface of the substrate:
  one or more radiation-sensitive imageable layers including an outermost radiation-sensitive imageable layer, and
  optionally, a non-radiation-sensitive hydrophilic overcoat disposed on the outermost radiation-sensitive imageable layer,
  to provide an imagewise exposed precursor comprising exposed regions and non-exposed regions in the one or more radiation-sensitive imageable layers;
(B) off-press, treating the imagewise exposed precursor with one or more successive applications of a developer that is capable of removing either the exposed regions or the non-exposed regions in the one or more radiation-sensitive imageable layers,
  to provide a lithographic printing plate; and
(D) mounting the lithographic printing plate onto a printing press for lithographic printing by applying a lithographic printing ink and a fountain solution to the lithographic printing plate, wherein the fountain solution is taken up by revealed hydrophilic surface of the substrate and the lithographic printing ink is taken up by remaining regions of the one or more radiation-sensitive imageable layers,
  wherein the developer in the one or more successive applications comprises:
  one or more compounds represented by the following Structure (I), in an amount of at least 0.1 weight % and up to and including 10 weight %, based on the total weight of the developer,

$$R^1-C(=O)-N(R^2)-R^3 \quad (I)$$

wherein $R^1$, $R^2$, and $R^3$ independently represent hydrogen or a substituted or unsubstituted hydrocarbon group, or two or three of $R^1$, $R^2$, and $R^3$ are combined to form one or more cyclic rings, and the total number of carbon atoms in the Structure (I) molecule is at least 7 and up to and including 33.

2. The method of claim 1, wherein the total number of carbon atoms in the Structure (I) molecule is at least 8 and up to and including 22.

3. The method of claim 1, wherein the one or more compounds represented by Structure (I) are present in the developer in an amount of at least 0.2 weight % and up to and including 5 weight %, based on the total weight of the developer.

4. The method of claim 1, wherein the developer has a pH of at least 2 and up to and including 11.

5. The method of claim 1, wherein the developer further comprises one or more of the following additional components (1) through (4), all of which are different from the one or more compounds represented by Structure (I):
  component (1) that is a pH buffer composition and can be present in the processing solution in an amount of at least 0.1 weight % and up to and including 10 weight %, based on the total weight of the developer;
  component (2) that is a surfactant composition, and can be present in the processing solution in an amount of at least 0.1 weight % and up to and including 10 weight %, based on the total weight of the developer;
  component (3) that is a solution promoter, and can be present in the processing solution an amount of at least 0.1 weight % and up to and including 5 weight %, based on the total weight of the developer; and
  component (4) that is a hydrophilic surface protective composition, and can be present in an amount of at least 0.1 weight % and up to and including 10 weight %, based on the total weight of the developer.

6. The method of claim 1, wherein the developer has non-volatiles of at least 1% and up to and including 15 weight %.

7. The method of claim 1, comprising one or more of the following steps, in order:
  ($A_1$) heating the imagewise exposed precursor before step (B);
  ($A_2$) if the non-radiation-sensitive hydrophilic layer is present in the lithographic printing plate precursor, washing the imagewise exposed precursor before step (B) to remove the non-radiation-sensitive hydrophilic layer;
  (B) after using the preheating step ($A_1$) and using the washing step ($A_2$), off-pes treating the imagewise exposed precursor with the developer in the one or more successive applications that is capable of removing either the exposed regions or the non-exposed regions in the one or more radiation-sensitive imageable layers;
  ($C_1$) rinsing the lithographic printing plate with water after step (B);
  ($C_2$) applying a gumming solution to the lithographic printing plate after step (B), wherein the gumming solution can be different from the developer used in step (B), or it can be the same used in step (B) but adjusted to a different concentration of the one or more compounds represented by Structure (I);
  ($C_3$) drying, curing, or both drying and curing, the lithographic printing plate after step (B) using either blown hot air at a temperature of at least 40° C. and up to and including 150° C., irradiation with a light source, or both the blown hot air and the irradiation; and
  (D) mounting the lithographic printing plate onto the printing press for the lithographic printing by applying the lithographic printing ink and the fountain solution to the lithographic printing plate.

8. The method of claim 1, comprising treating the imagewise exposed precursor with at least two successive applications of the same or different developer comprising one or more compounds represented by Structure (I).

9. The method of claim 8, wherein excess developer is mechanically removed from the lithographic printing plate between the at least two successive applications of the same or different developer.

10. The method of claim 1, wherein each of the one or more successive applications of the developer is carried out in a dip tank or with a spray bar processor, each at a temperature of at least 20° C. and up to and including 40° C., and optionally while using at least one rotating brush.

11. The method of claim 1, further comprising, in order:
  ($A_1$) optionally heating the imagewise exposed precursor;
  (B) off-press treating the imagewise exposed precursor with the developer in the one or more successive applications to remove either the exposed regions or the non-exposed regions in the one or more radiation-sensitive imageable layers,
  to provide the lithographic printing plate; and
  ($C_2$) applying a gumming solution to the lithographic printing plate after step (B), which gumming solution can be the developer comprising one or more compounds represented by Structure (I), or the gumming solution can be a solution containing no compounds represented by Structure (I).

12. The method of claim 1, wherein the lithographic printing plate precursor is a negative-working lithographic printing plate precursor comprising a negative-working radiation-sensitive imageable layer that is sensitized to near-infrared or infrared radiation having a wavelength of at least 750 nm; or to UV or visible radiation having a wavelength of at least 250 nm and up to and including 550 nm, and the off-press treating of the imagewise exposed precursor with the developer in the one or more successive applications removes the non-exposed regions of the negative-working radiation-sensitive imageable layer to reveal the hydrophilic surface of the substrate.

13. The method of claim 12, wherein the negative-working radiation-sensitive imageable layer comprises one or more free radical polymerizable components, an initiator composition comprising one or more free radical initiators, and one or more radiation absorbing compounds.

14. The method of claim 13, wherein the one or more free radical polymerizable components are one or more urethane (meth)acrylate compounds.

15. A method for preparing a lithographic printing plate, the method comprising the steps of, in order:
(A) imagewise exposing a lithographic printing plate precursor comprising a substrate having a hydrophilic surface, and having disposed on the hydrophilic surface of the substrate:
one or more radiation-sensitive imageable layers including an outermost radiation-sensitive imageable layer, and
optionally, a non-radiation-sensitive hydrophilic overcoat disposed on the outermost radiation-sensitive imageable layer,
to provide an imagewise exposed precursor comprising exposed regions and non-exposed regions in the one or more radiation-sensitive imageable layers;
(B) off-press, treating the imagewise exposed precursor with one or more successive applications of a developer that is capable of removing either the exposed regions or the non-exposed regions in the one or more radiation-sensitive imageable layer,
to provide a lithographic printing plate; and
(D) mounting the lithographic printing plate onto a printing press for lithographic printing by applying a lithographic printing ink and a fountain solution to the lithographic printing plate, wherein the fountain solution is taken up by revealed hydrophilic surface of the substrate and the lithographic printing ink is taken up by remaining regions of the one or more radiation-sensitive imageable layers,
wherein the developer is prepared in situ by diluting a developer concentrate with water,
the developer concentrate having a pH of at least 2 and a % non-volatiles of at least 3% and up to and including 45%, the developer concentrate comprising:
one or more compounds represented by the following Structure (I), in an amount of at least 0.2 weight % and up to and including 30 weight %, based on the total weight of the developer concentrate:

$$R^1-C(=O)-N(R^2)-R^3 \qquad (I)$$

wherein $R^1$, $R^2$, and $R^3$ independently represent hydrogen or a substituted or unsubstituted hydrocarbon group, or two or three of $R^1$, $R^2$, and $R^3$ are combined to form one or more cyclic rings, and the total number of carbon atoms in the Structure (I) molecule is at least 7 and up to and including 33.

* * * * *